(12) United States Patent
Yang et al.

(10) Patent No.: US 11,308,245 B2
(45) Date of Patent: Apr. 19, 2022

(54) SYSTEMS AND METHODS FOR FACILITATING EVALUATION OF CHARACTERISTICS RELATED TO QUALITY

(71) Applicant: Caterpillar Inc., Deerfield, IL (US)

(72) Inventors: Yihong Yang, Champaign, IL (US); Amit Kashyap, Elgin, IL (US); Abdul Aziz Baig Mirza, Champaign, IL (US); Abhishek Ramaswamy, Karnataka (IN); Mihai Sandulescu, Saint Charles, IL (US); Jeffrey Paul Sayre, Glen Ellyn, IL (US); Cody LeRoy Webster, Peoria, IL (US); Scott Antonio Zacek, Savoy, IL (US)

(73) Assignee: Caterpillar Inc., Peoria, IL (US)

( * ) Notice: Subject to any disclaimer, the term of this patent is extended or adjusted under 35 U.S.C. 154(b) by 748 days.

(21) Appl. No.: 16/242,621

(22) Filed: Jan. 8, 2019

(65) Prior Publication Data
US 2020/0218784 A1   Jul. 9, 2020

(51) Int. Cl.
*G06F 30/00* (2020.01)
*G06F 16/9038* (2019.01)
(Continued)

(52) U.S. Cl.
CPC .......... *G06F 30/00* (2020.01); *G06F 16/9027* (2019.01); *G06F 16/9038* (2019.01); *G06T 17/20* (2013.01)

(58) Field of Classification Search
None
See application file for complete search history.

(56) References Cited

U.S. PATENT DOCUMENTS

| | | | |
|---|---|---|---|
| 6,033,107 A * | 3/2000 | Farina | G01K 1/02 374/161 |
| 7,203,628 B1 * | 4/2007 | St. Ville | G06F 30/23 703/1 |

(Continued)

FOREIGN PATENT DOCUMENTS

DE   WO2002014967 A2   2/2002

OTHER PUBLICATIONS

English Translation of WO2002014967A2 published Feb. 21, 2002, 12 pages.

*Primary Examiner* — Craig C Dorais
(74) *Attorney, Agent, or Firm* — Lee & Hayes, PLLC

(57) ABSTRACT

A system for facilitating evaluation of characteristics related to quality associated with a machine design may include a user input device configured to generate a query related to one or more characteristics related to quality associated with a machine design. The system may also include a display device configured display images, and a processor in communication with the user input device and the display device. The processor may be configured to receive a query from the user input device, access data representative of the machine design, and generate image data representative of characteristics related to quality associated with the machine design. The image data may be communicated to the display device to display a machine image including a color-coded representation of at least a portion of a machine and a textual image including textual representations of information related to the machine design.

16 Claims, 14 Drawing Sheets

(51) Int. Cl.
*G06F 16/901* (2019.01)
*G06T 17/20* (2006.01)

(56) References Cited

U.S. PATENT DOCUMENTS

| | | |
|---|---|---|
| 8,738,342 B2 | 5/2014 | Lind et al. |
| 8,832,620 B1 | 9/2014 | Fried et al. |
| 9,946,732 B2 | 4/2018 | Maranzana et al. |
| 2004/0083016 A1 | 4/2004 | Fischer |
| 2008/0187215 A1* | 8/2008 | Gordon ............... H04N 1/6058 382/162 |
| 2009/0157569 A1 | 6/2009 | Henby et al. |
| 2016/0239583 A1 | 8/2016 | Daiberl |

* cited by examiner

1400

```
┌─────────────────────────────────────────────────────────┐
│ RECEIVE A QUERY FROM A USER INPUT DEVICE, THE QUERY     │
│ RELATED TO ONE OR MORE CHARACTERISTICS RELATED TO       │
│ QUALITY ASSOCIATED WITH A MACHINE DESIGN                │
│ 1402                                                    │
└─────────────────────────────────────────────────────────┘
                            │
                            ▼
┌─────────────────────────────────────────────────────────┐
│ ACCESS, BASED AT LEAST IN PART ON THE QUERY, DATA       │
│ REPRESENTATIVE OF THE MACHINE DESIGN                    │
│ 1404                                                    │
└─────────────────────────────────────────────────────────┘
                            │
                            ▼
┌─────────────────────────────────────────────────────────┐
│ GENERATE IMAGE DATA REPRESENTATIVE OF CHARACTERISTICS   │
│ RELATED TO QUALITY ASSOCIATED WITH THE MACHINE DESIGN   │
│ 1406                                                    │
└─────────────────────────────────────────────────────────┘
                            │
                            ▼
┌─────────────────────────────────────────────────────────┐
│ DISPLAY VIA A DISPLAY DEVICE, BASED AT LEAST IN PART ON │
│ THE IMAGE DATA, ONE OR MORE IMAGES REPRESENTATIVE OF    │
│ CHARACTERISTICS RELATED TO QUALITY ASSOCIATED WITH THE  │
│ MACHINE DESIGN                                          │
│ 1408                                                    │
└─────────────────────────────────────────────────────────┘
```

*FIG. 14*

SYSTEMS AND METHODS FOR FACILITATING EVALUATION OF CHARACTERISTICS RELATED TO QUALITY

TECHNICAL FIELD

The present disclosure relates to systems and methods for facilitating evaluation of characteristics related to quality, and more particularly, to systems and methods for facilitating evaluation of characteristics related to quality associated with machine designs.

BACKGROUND

As a product or process proceeds from concept, to design, development, manufacturing, and shipment, it may be subjected to multiple internal reviews of the level of quality of the product or process. As a product or process becomes more complex, multiple organizational groups may be involved with such reviews. For example, a complex machine may include tens or even hundreds of parts that may be designed, developed, and/or obtained from different entities, including, for example, both in-house manufacturing groups and outside suppliers. As a result, reviews of the level of quality of the product or process may not be performed in a consistent or satisfactory manner by one or more of the entities. In addition, particularly for complex products or processes, large amounts of data may be required to describe parameters related to the products or processes. As a result, computer-assisted reviews of the level of quality of different aspects of the product or process may consume large amounts of processing capacity and/or time, potentially slowing the review process. In addition, some aspects related to the overall level of quality of the product or process may be difficult to review in an efficient manner, such as, for example, cost-related data, warrantee-related data, and/or supply-chain data.

An attempt to provide a method and system for analyzing three-dimensional models is described in U.S. Pat. No. 9,946,732 B2 ("the '732 patent") to Maranzana et al., issued Apr. 17, 2018. Specifically, the '732 patent describes a method purportedly allowing digital three-dimensional models to be indexed, searched, compared, and the results displayed in a three-dimensional space. The method of the '732 patent includes complementary parts of displaying, comparing/searching, face reconciliation, and ranking results. According to the '732 patent, each of these parts can fit in one another or be used independently, and implementation of a process for searching/comparing three-dimensional models based on descriptors at least partly related to faces requires a face reconciliation process, which the '732 patent characterizes as pairing of faces between three-dimensional models.

Although the system of the '732 patent purports to provide a method for comparing two or more three-dimensional models to one another, it does not provide a system or method for facilitating review of the level of quality associated with products or processes by different entities in a relatively consistent manner and or a level of quality associated with a number of different aspects related to quality. Thus, the method of the '732 patent may not be useful in situations such as those noted herein.

The systems and methods disclosed herein may be directed to mitigating or overcoming one or more of the possible drawbacks set forth above.

SUMMARY

According to a first aspect, a system for facilitating evaluation of characteristics related to quality associated with a machine design may include a user input device configured to generate a query related to one or more characteristics related to quality associated with a machine design. The system may also include a display device configured to display images representative of characteristics related to quality associated with a machine design, and a processor in communication with the user input device and the display device. The processor may be configured to receive a query from the user input device. The query may be related to one or more characteristics related to quality associated with the machine design. The processor may also be configured to access, based at least in part on the query, data representative of the machine design, and generate image data representative of characteristics related to quality associated with the machine design. The processor may also be configured to communicate the image data to the display device to display one or more images representative of characteristics related to quality associated with the machine design. The one or more images representative of characteristics related to quality associated with the machine design may include a machine image including a color-coded representation of at least a portion of a machine associated with the machine design, and a textual image including textual representations of information related to the machine design, wherein the color-coded representation may facilitate analysis of the one or more characteristics related to quality.

According to a further aspect, a computer-implemented method for evaluating characteristics related to quality associated with a machine design may include receiving a query from a user input device. The query may be related to one or more characteristics related to quality associated with the machine design. The method may further include accessing, based at least in part on the query, data representative of the machine design, and generating image data representative of characteristics related to quality associated with the machine design. The method may also include displaying via a display device, based at least in part on the image data, one or more images representative of characteristics related to quality associated with the machine design. The one or more images representative of characteristics related to quality associated with the machine design may include a machine image including a color-coded representation of at least a portion of a machine associated with the machine design, and a textual image including textual representations of information related to the machine design, wherein the color-coded representation may facilitate analysis of the one or more characteristics related to quality.

According to another aspect, a system may include one or more processors and memory storing computer-executable instructions that, when executed, cause the one or more processors to generate a user interface. The user interface may include a selectable option to access data representative of a machine design, and a selectable option to display via a display device, based at least in part on the data representative of the machine design, one or more images representative of characteristics related to quality associated with the machine design. The one or more images representative of characteristics related to quality associated with a machine design may include a machine image including a color-coded representation of at least a portion of a machine associated with the machine design, and a textual image including textual representations of information related to the machine design, wherein the color-coded representation may facilitate analysis of the one or more characteristics related to quality.

BRIEF DESCRIPTION OF THE DRAWINGS

The detailed description is described with reference to the accompanying figures. In the figures, the left-most digit or digits of a reference number identifies the figure in which the reference number first appears. The same reference numbers in different figures indicate similar or identical items.

FIG. 14 illustrates a flow diagram of an example process 1400 for evaluating characteristics related to quality associated with a machine design.

DETAILED DESCRIPTION

Figure 1:
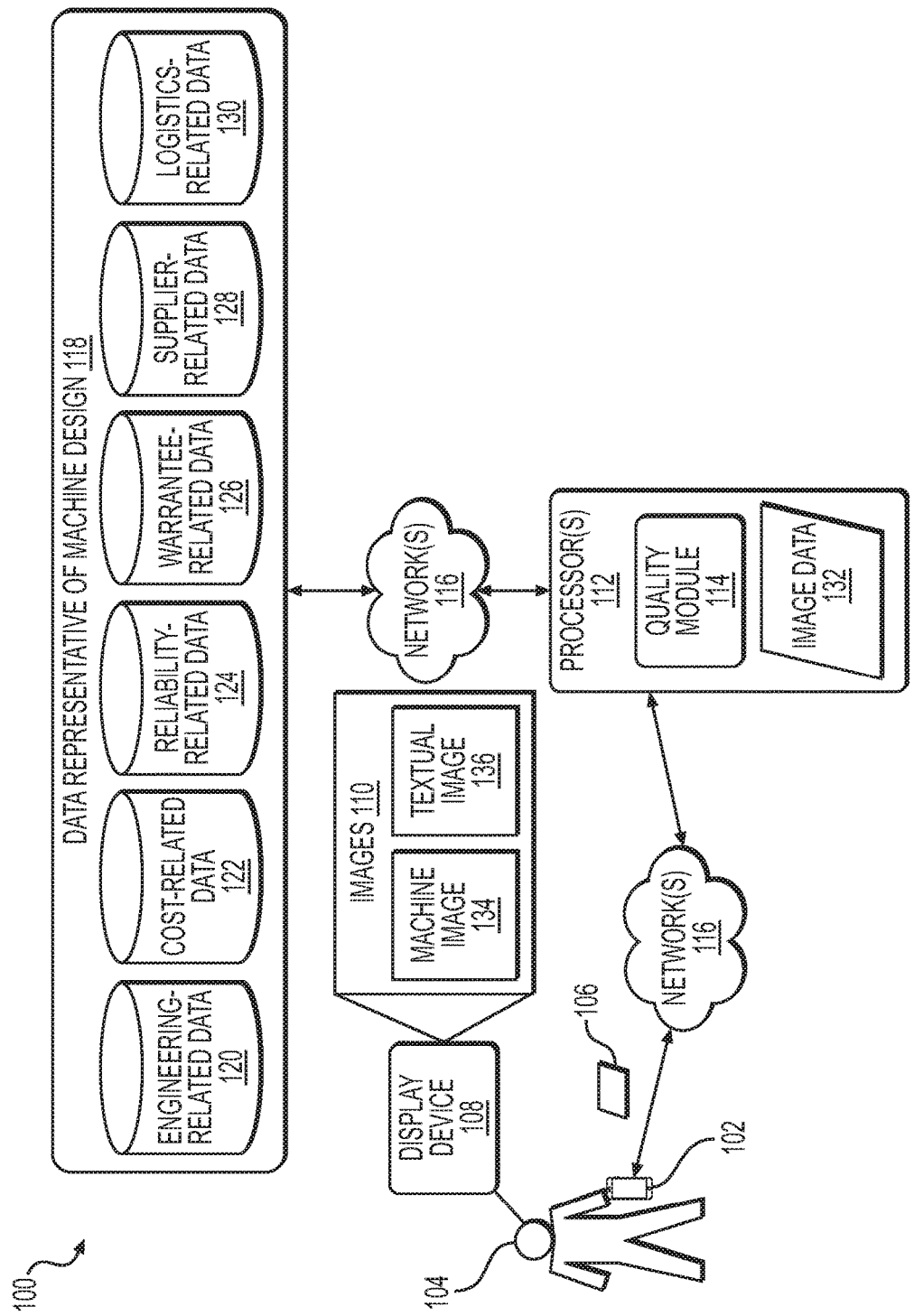
FIG. 1 is a schematic depiction of an example system for facilitating evaluation of characteristics related to quality associated with a machine design.

FIG. 1 is a schematic depiction of an example system 100 for facilitating evaluation of characteristics related to quality associated with a machine design. In the example shown, the system 100 includes a user input device 102 for use by a user 104 and configured to generate a query 106 related to one or more characteristics related to quality associated with a machine design. For example, the input device 102 may be any known electronic device capable of communicating a query to the system 100. The system 100 may also include a display device 108 configured display images 110 representative of characteristics related to quality associated with a machine design. For example, the display device 108 may be any know electronic device capable of displaying images. In some examples, the display device 108 may be associated with (e.g., coupled to and/or integrated with) the user input device 102. The system 100 may further include one or processors 112 including, for example, a quality module 114. For example, the one or more processors 112 may be in communication with the user input device 102 and the display device 108 via, for example, one or more networks 116. For example, the one or more network(s) 116 may include any known type of communication network, such as a public wide-area-network (WAN) (e.g., the Internet), which may utilize various different technologies including wired and wireless technologies.

In some examples, the one or more processors 112 may be configured to receive the query 106 from the user input device 102, for example, via the one or more networks 116. In some examples, the query 106 may be related to one or more characteristics related to quality associated with the machine design, for example as described herein. In some examples, the one or more processors 112 may be configured to access, based at least in part on the query 106, data representative of the machine design 118. For example, the one or more processors 112 may be configured to access a database via one or more networks 116. In some examples, the data representative of machine design 118 may include one or more of engineering-related data 120, cost-related data 122, reliability-related data 124, warrantee-related data 126, supplier-related data 128, or logistics-related data 130. In some examples, the one or more processors 112 may also be configured to generate image data 132 representative of characteristics related to quality associated with the machine design. For example, the quality module 114 may be configured to receive the query 106, access one or more databases including the data representative of a machine design 118, and generate the image data 132. In some examples, the image data 132 may be communicated to the display device 108 via one or more of the networks 116, and the display device 108 may be configured to display, based at least in part on the image data 132, one or more images 110 representative of characteristics related to quality associated with the machine design. For example, as shown in FIG. 1, the images 110 may include a machine image 134, which may include a color-coded representation of at least a portion of a machine associated with the machine design (e.g., a solid machine model), and in some examples, a textual image 136 including textual representations of information related to the machine design. In some examples, as explained herein, the color-coded representation may facilitate analysis of the one or more characteristics related to quality.

In some examples, the concurrent processing of the nodes branches 306 may result in obtaining the image data 132 between two and ten times more quickly (e.g., between four and six times more quickly) as compared to sequentially processing the data of the node tree structure, depending on for example, the complexity and/or amount of data of the data representative of the machine design. In some examples, the increase in processing speed (e.g., the decrease in processing time) may increase as compared to sequential processing may increase with increased complexity and/or amount of data for the data representative of the machine design 118 (e.g., there may be greater time savings with more complex and/or greater amounts of data).

Figure 2:
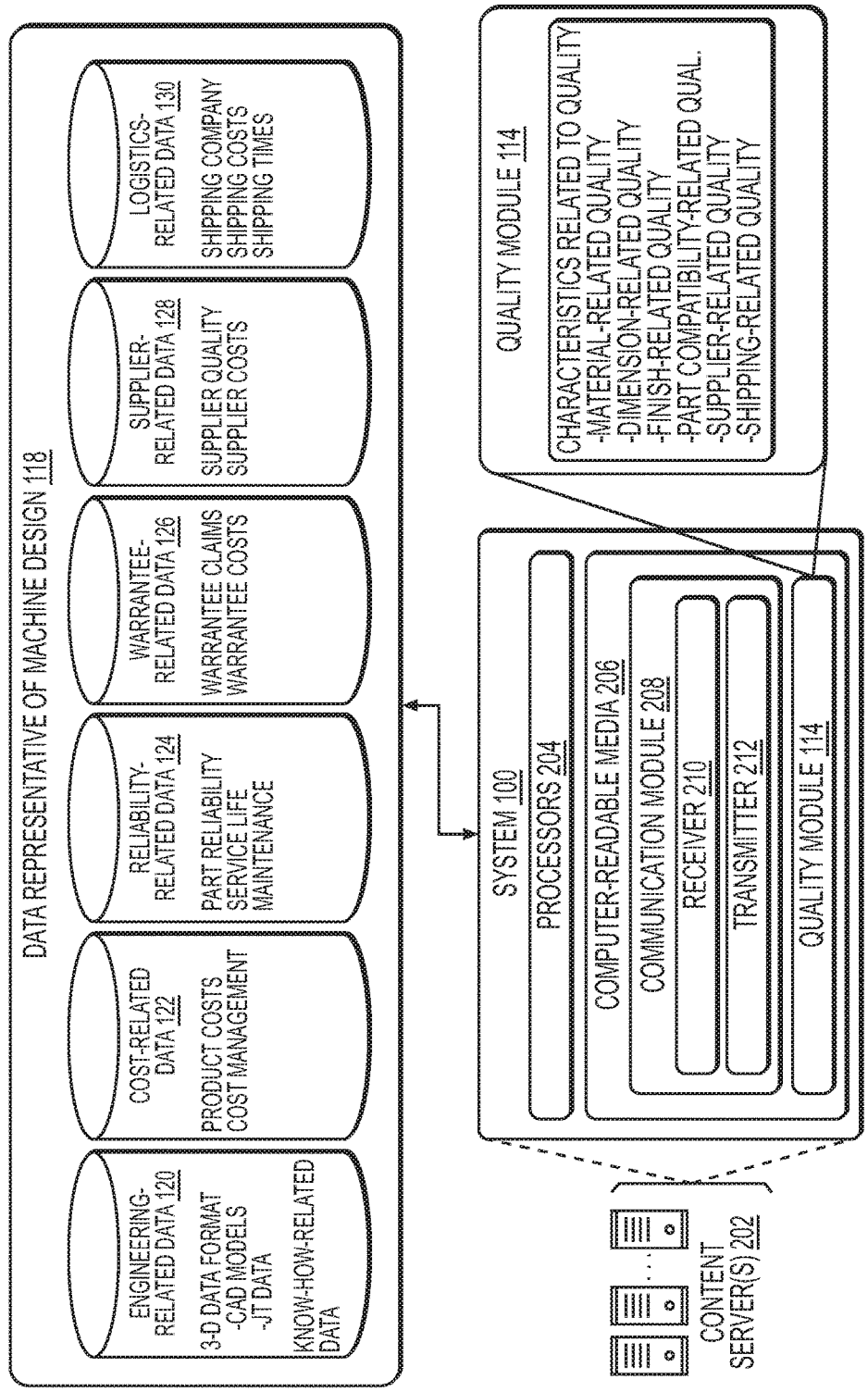
FIG. 2 is a schematic depiction of an example system for facilitating evaluation of characteristics related to quality associated with a machine design, including an example architecture for implementing the system.

FIG. 2 is a schematic depiction of an example system 100 for facilitating evaluation of characteristics related to quality associated with a machine design, including an example architecture 200 for implementing the system 100. For example, as shown in FIG. 2, the system 100 includes one or more content server(s) 202. The one or more networks 116 may facilitate communications/interactions via any type of network, such as a public wide-area-network (WAN) (e.g., the Internet), which may utilize various different technologies including wired and wireless technologies. The content server(s) 202 may contain any number of servers that may be arranged as a server farm. Other server architectures may also be used to implement the content server(s) 202. As shown, the content server(s) 202 include the one or more processor(s) 204, which may correspond to the one or more processors 112 shown in FIG. 1, and computer-readable media 206. In the example shown, the computer-readable media 206 includes a communication module 208 including a receiver 210 and a transmitter 212, and the quality module 114.

In some examples, the one or more processors 204 may execute the quality module 114 and any other modules associated with the system 100 to cause the system 100 and/or the content servers 202 to perform a variety of functions, as set forth above and explained in further detail herein. In some examples, the processor(s) 204 may include a central processing unit (CPU), a graphics processing unit (GPU), both CPU and GPU, or other processing units or components known in the art. Additionally, each of the processors 204 may possess its own local memory, which also may store program modules, program data, and/or one or more operating systems.

The computer-readable media 206 may include volatile memory (e.g., RAM), non-volatile memory (e.g., ROM, flash memory, miniature hard drive, memory card, or the like), or some combination thereof. The computer-readable media 206 may be non-transitory computer-readable media. The computer-readable media 206 may include or be associated with the one or more of the above-noted modules, which perform various operations associated with the system 100 and/or the content server(s) 202. In some examples, one or more of the above-noted modules may include or be associated with computer-executable instructions that are stored by the computer-readable media 206 and that are executable by the one or more processors 204 to perform such operations. The system 100 and/or the content server(s) 202 may also include additional components not listed above that may perform any function associated with the system 100 and/or the content server(s) 202.

In some examples, the communication module 208 may be configured to facilitate communication of data between one or more of the user input device 102, the one or more processors 112, the data representative of machine design 118, and/or the display device 108. For example, the communication module 208 may include the receiver 210, which may be configured to receive one or more signals from the user input device 102 via, for example, the one or more networks 116. Such signals may include the query 106 from the user input device 102. In some examples, for example, as shown in FIG. 2, the communications module 208 may include the transmitter 212, which may be configured to transmit one or more signals via the one or more networks 116. Transmission of other data available to the system 100 is also contemplated. In some examples, the receiver 210 and the transmitter 212 may take the form of a transceiver.

As shown in FIG. 2, the data representative of machine design 118 may include engineering-related data 120, which may include, for example, a three-dimensional data format representative of the machine design (e.g., a solid machine model). For example, the three-dimensional data format may include computer-aided design (CAD) data and/or Jupiter Tesselation (JT) data, which may include, for example, approximate (faceted) data, boundary representation surfaces (NURBS), product and manufacturing information (PMI), metadata (e.g., textual attributes), and/or any other similar data.

As shown in FIG. 2, the engineering-related data 120 may also include know-how-related data. For example, the know-how-related data may be representative of at least one of preferred design characteristics, hardware verification, a thickness analysis, sub-standard part identification, a hose-material and hose-size verification, preferred materials, preferred sizes, design verification, etc. As shown in FIG. 2, in some examples, the characteristics related to quality may include at least one of material-related quality, dimension-related quality, finish-related quality, part compatibility-related quality, supplier-related quality, or shipping-related quality.

Figure 3:
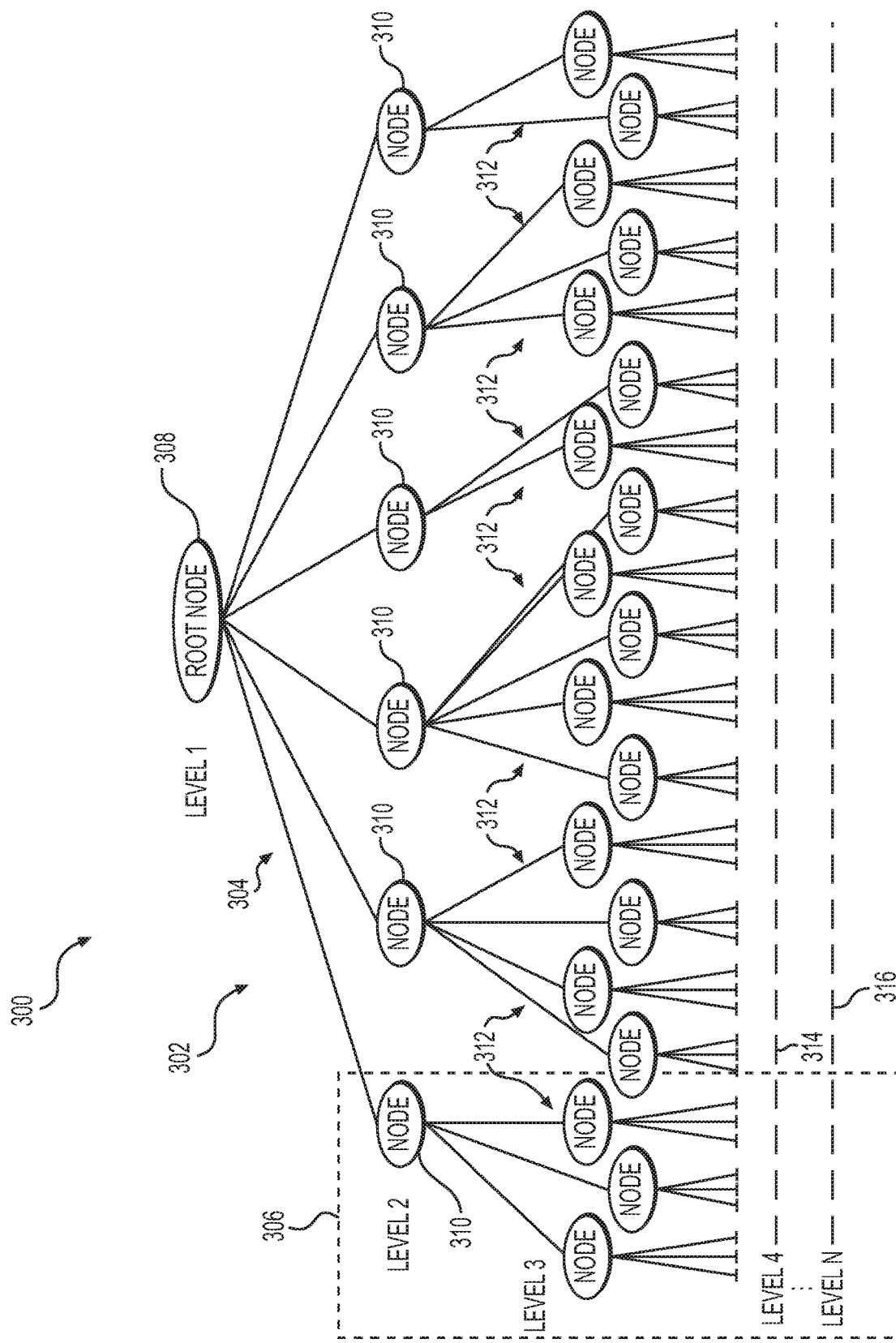
FIG. 3 is a schematic depiction of example data representative of an example machine design including a plurality of nodes in an example node tree structure.

FIG. 3 is a schematic depiction of example data representative of a machine design 300, which may correspond to the data 118 shown in FIG. 1. In the example shown in FIG. 3, the data representative of machine design 300 includes a three-dimensional data format representative of the machine design. In some examples, the three-dimensional data format may include a plurality of nodes 302. In some such examples, the one or more processors 112 may be configured to arrange, based at least in part on the query 106 related to one or more characteristics related to quality associated with the machine design, the plurality of nodes 302 into a node tree structure 304 including a plurality of node branches 306 (only one of which is identified in FIG. 3). The one or more processors 112 may also be configured to generate the image data 132 representative of characteristics related to quality associated with the machine design by processing two or more of the node branches 306 substantially concurrently. In some examples, the node tree structure 304 may include a root node 308 and lower levels of the nodes 302, for example, Level 2 nodes 310, Level 3 nodes 312, Level 4 nodes 314, through Level N nodes 316.

For example, the root node 308 may be representative of all data related to a machine design and each lower level node in the node tree structure may be related to different data related the machine design. For example, if the machine design relates to a hydraulic excavator, the root node 308 may correlate to data related to the hydraulic excavator design. The Level 2 nodes 310 may include a plurality of nodes corresponding to different structures related to the machine design of the hydraulic excavator, such as, for example, a Level 2 node 310 corresponding to a power system including an internal combustion engine and/or any other power source configured to provide power to the hydraulic excavator, a Level 2 node 310 corresponding to a hydraulic system of the hydraulic excavator including, for example, hydraulic pumps, accumulators, actuators, valves, etc., a Level 2 node 310 corresponding to a control system of the hydraulic excavator including any sensor systems and electronic controls for controlling operation of the power system and hydraulic system, a Level 2 node 310 corresponding to the chassis of the hydraulic actuator including connection points and fixtures for coupling the power system, the hydraulic system, carriage, tracks, etc., to the hydraulic excavator.

Each of the Level 2 nodes 310 may correspond to a node branch 306 that includes additional data corresponding features and data related to the respective Level 2 nodes 310. For example, a Level 3 node 312 corresponding to a level 2 node 310 relating to the power system may correspond to an internal combustion engine and a Level 4 node 314 under the Level 3 node 312 may corresponding to an engine block of the internal combustion engine, etc. In some examples, the node branches 306 may correspond to specific details related to the nodes 302 at higher node levels. In addition, textual data may correspond to higher node levels, for example, approaching Level N nodes.

In some examples, based on the query 106 received from the user input device 102, the system 100 (e.g., the quality module 114) may be configured process data of the node tree structure 304 in an at least partially concurrent manner, for example, rather than a substantially sequential manner to create the image data 132 for display via the display device 108. For example, according to some versions of sequential processing, the data representative of a machine design 118 may be provided in the form of a list of data, and a sequential processing technique may be configured to process the data in a sequential manner by beginning at one end of the list and sequentially processing the data from the one end in a sequential, step-by-step ordered manner to the opposite end of the list of data. In some examples of the system 100 described herein, the system 100 may be configured to process two or more node branches 306 in a parallel manner (rather than sequentially), for example, such that the respective data associated with two or more the node branches 306 are processed by the one or more processors 112 concurrently (e.g., substantially simultaneously). For example, based on the query 106, the one or more processors 112 may begin processing the data of the node tree structure 304 by beginning the processing at Level 2, Level 3, Level 4, or, in some instances, at lower levels (e.g., levels having a higher level number, for example, Level 4 being a lower level than Level 3). Once the one or more processors determines the node level at which to begin the processing, the one or more processors 112 may concurrently process each of the node branches associated with the node level.

For example, in the example shown in FIG. 3, Level 1 includes the single root node 308, Level 2 includes six Level 2 nodes 310, and Level 3 includes nineteen Level 3 nodes 312. In some examples, the one or more processors 112 may identify the node level at which to begin concurrent processing, and thereafter begin concurrently processing the remainder of the node branches associated with each of the nodes of the identified node level. For example, based on the query 106, the one or more processors 112 may identify the Level 3 nodes 312 as the node level at which to begin processing. In the example shown, Level 3 includes nineteen Level 3 nodes 312, and thus, the one or more processors 112 would begin concurrent processing of the data in each of the nineteen node branches 306 associated with each of the respective nineteen Level 3 nodes 312. Identification of the node level on which to base the processing may be based, at least in part, on the number of nodes in the identified node level. This may be based on the level of complexity and/or the amount of the data associated with the data representative of the machine design, which may be different for different machine designs. In some examples, the one or more processors may identify a node level having a number of nodes ranging from about twenty-five nodes to about 250 nodes, for example, from about fifty nodes to about 200 nodes. Other ranges of nodes are contemplated and may be based on, at least in part, for example, the computing capacity of the one or more processors 112, the complexity and/or amount of data representative of the machine design 118, and/or the query 106. Once the node level is selected, for example, by the one or more processors 112 and/or the user 104, the one or more processors 112 may concurrently process the data to generate the image data 132 for display via the display device 108.

As explained in more detail with respect to FIGS. 4-13, the color-coded representation may include a combination of colors for highlighting the characteristics related to quality, wherein the one or more processors 112 is configured to facilitate selection of one combination of colors from among a plurality of combinations of colors for highlighting the characteristics related to quality. In some examples, each of the combinations of colors differs from one another. In some examples, the textual representations of information related to the machine design may include one or more tables supplementing the color-coded representations, and, in some examples, the textual representations may be color-coded. For example, colors in the machine images 134 may correspond or coordinate with respect to colors in the textual images 136.

Figure 4:
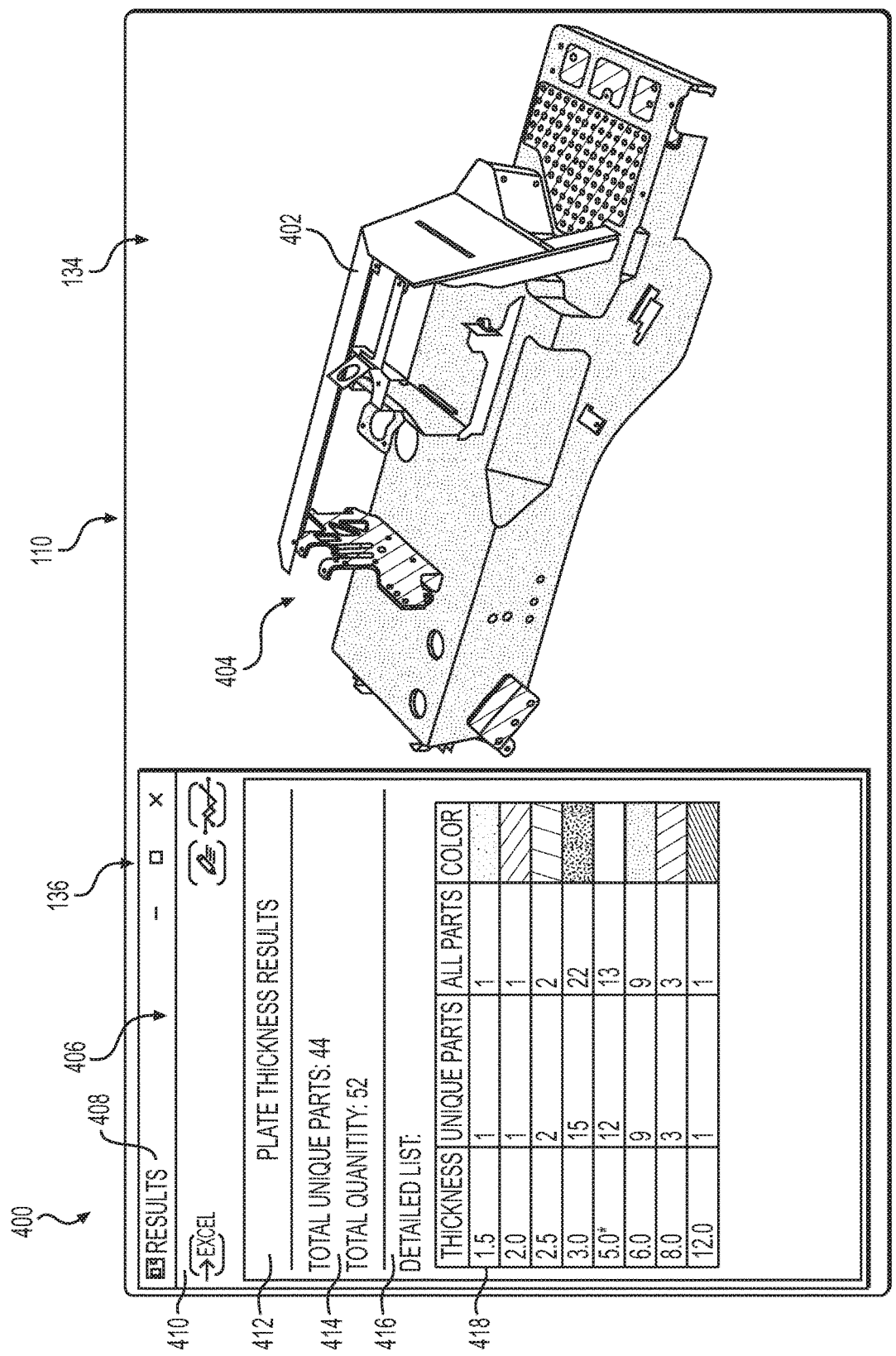
FIG. 4 is schematic depiction of an example user interface including an example representation of a portion of an example machine design and example textual representations of engineering-related data related to the example machine design.

FIG. 4 is a schematic depiction of an example user interface 400 including an example representation of a portion of an example machine design and example textual representations of engineering-related data related to the example machine design. For example, as shown in FIG. 4, the example user interface 400 includes images 110 based on image data generated by the one or more processors 112 (e.g., the quality module 114) in response to a query 106 received from the user input device 102. For example, the user 104 may submit a query 106 via the user input device 102 requesting quality-related data associated with plate thicknesses associated with a machine chassis 402 shown in the example images 110 of the example user interface 400. For example, an engineer wishing to evaluate information associated with plate thicknesses associated with the machine chassis 402 may submit a corresponding query 106 via a user interface (not shown in FIG. 4), and the one or more processors 112 may access a database and/or process data representative of the machine design 118, for example, as described herein. The one or more processors 112 may generate image data 132 representative of characteristics related to quality associated with the machine design, and the image data 132 may be communicated to the display device 108 to display the one or more images 110 representative of characteristics related to quality associated with the machine design. In the example shown in FIG. 4, the one or more images 110 may include a machine image 134 including a color-coded representation 404 of at least a portion of the machine associated with the machine design, and, in some examples, a textual image 136 including textual representations 406 of information related to the machine design. As described herein, the color-coded representation 404 may facilitate analysis of the one or more characteristics related to quality, for example, plate thicknesses associated with the machine design.

As shown in FIG. 4, in the example machine image 134, different parts of the machine chassis 402 are in different colors based on the corresponding thickness of the different parts of the machine chassis 402 (e.g., shown in FIG. 4 using different shading and cross-hatching techniques). In some examples, the user interface 400 may facilitate reorientation of the machine image 134, for example, so that different parts of the machine chassis 402 are capable of being viewed via the display device 108. For example, selecting the machine image 134 using a selector (e.g., clicking a button on a mouse or tablet) and moving a cursor may permit re-orientation of the machine image 134 to view desired portions of the machine chassis 402.

In the example shown, the textual image 136 of the user interface 400 displays textual representations 406 of information related to the machine chassis 402 shown in the machine image 134. For example, the textual image 136 includes a results banner 408 ("RESULTS") indicating the textual image 136 shows results related to the query 106. The example textual image 136 also includes a selection bar 410 facilitating generation of additional information by selecting an icon associated with, for example, a spreadsheet (e.g., "EXCEL®") and/or other functions (e.g., creating a text box and/or adding mark-ups to the machine image 134). The example user interface 400 also includes a query title field 412 identifying a title related to the query 106 (e.g., "PLATE THICKNESS RESULTS"). The example user interface 400 also includes a parts-counts field 414 showing the number of parts included in the query results (e.g., the number of parts shown in the corresponding machine image 134), which in some examples, may be separated into different categories (e.g., total unique parts vs. total parts), for example, as shown in FIG. 4.

The example user interface 400 shown in FIG. 4 also includes a details field 416 providing a details table 418 of details related to the query 106. For example, the details table 418 shown in FIG. 4 provides a list of the different part thicknesses and corresponding data related to the different thicknesses (e.g., the number of unique parts of the machine chassis 402 having the listed thickness, the total number of parts having the listed thickness, and a color-code legend showing the color corresponding to the listed thickness and the corresponding part(s) shown in the machine image 134 having the listed thickness). The colors may include, for example, different hues and/or shades of red orange, yellow, green, blue, indigo, and/or violet. In some examples, providing the color-coded depiction in the machine image 134 may render it relatively easier for an engineer to evaluate and/or analyze quality related to the plate thicknesses (and/or other characteristics) associated with the machine design.

Figure 5:
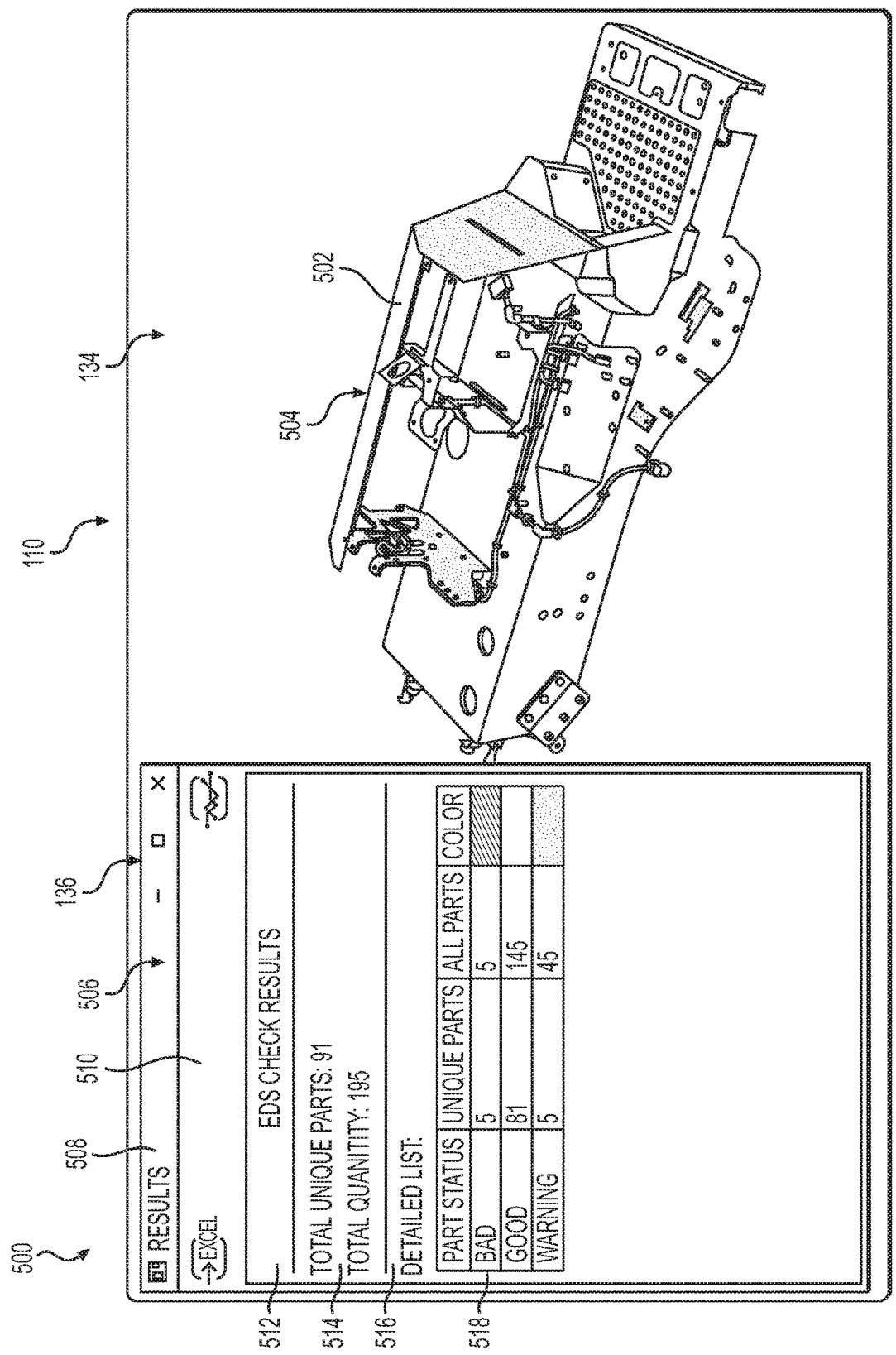
FIG. 5 is another example user interface including an example representation of a portion of an example machine design and example textual representations of engineering-related data related to the example machine design.

FIG. 5 is another example user interface 500 including an example representation of a portion of an example machine design and example textual representations of engineering-related data related to the example machine design. For example, as shown in FIG. 5, the example user interface 500 includes images 110 based on image data 132 generated by the one or more processors 112 (e.g., the quality module 114) in response to a query 106 received from the user input device 102. For example, the user 104 may submit a query 106 via the user input device 102 requesting quality-related data associated with engineering-related data associated with a machine chassis 502 shown in the example images 110 of the example user interface 500. For example, an engineer wishing to evaluate information associated with engineering-related data associated with the machine chassis 502 may submit a corresponding query 106 via a user interface (not shown in FIG. 5), and the one or more processors 112 may access a database and/or process data representative of the machine design 118, for example, as described herein. The one or more processors 112 may generate image data 132 representative of characteristics related to quality associated with the machine design, and the image data 132 may be communicated to the display device 108 to display the one or more images 110 representative of characteristics related to quality associated with the machine design. In the example shown in FIG. 5, the one or more images 110 may include a machine image 134 including a color-coded representation 504 of at least a portion of the machine associated with the machine design, and, in some examples, a textual image 136 including textual representations 506 of information related to the machine design. As described herein, the color-coded representation 504 may facilitate analysis of the one or more characteristics related to quality, for example, engineering-related data associated with the machine design, such as, for example, whether the design includes parts that are no longer available, parts that are limited in supply and/or availability, parts having an undesirably high number of incidents related to warrantee-related repair and/or replacement, and/or parts having a sufficient supply and a history of no- or low-warrantee-related repair and/or replacement.

As shown in FIG. 5, in the example machine image 134, different parts of the machine chassis 502 are shown in different colors based on the engineering-related data associated with different parts of the machine chassis 502 (e.g., shown in FIG. 5 using different shading and cross-hatching techniques). In some examples, the user interface 500 may facilitate reorientation of the machine image 134, for example, as explained herein with respect to FIG. 4.

In the example shown in FIG. 5, the textual image 136 of the user interface 500 displays textual representations 506 of information related to the machine chassis 502 shown in the machine image 134. For example, the textual image 136 includes a results banner 508 ("RESULTS") indicating the textual image 136 shows results related to the query 106. The example textual image 136 also includes a selection bar 510 facilitating generation of additional information by selecting an icon associated with, for example, a spreadsheet (e.g., "EXCEL®") and/or other functions (e.g., adding mark-ups to the machine image 134). The example user interface 500 also includes a query title field 512 identifying a title related to the query 106 (e.g., "EDS CHECK RESULTS"). The example user interface 500 also includes a parts-count field 514 showing the number of parts included in the query results (e.g., the number of parts shown in the corresponding machine image 134), which, in some examples, may be separated into different categories (e.g., total unique parts vs. total parts), for example, as shown in FIG. 5.

The example user interface 500 shown in FIG. 5 also includes a details field 516 providing a details table 518 of details related to the query 106. For example, the details table 518 shown in FIG. 5 provides a list of part categories corresponding to different engineering-related data (e.g., the number of unique parts and total number of parts of the machine chassis 502 not available or having limited availability ("BAD"), the number of unique parts and total number of parts of the machine chassis 502 that have no availability-related issues ("GOOD"), the number of unique and total parts that may have limited availability ("WARN- ING"), and a color-code legend showing the color corresponding to the "BAD," "GOOD," and/or "WARNING" status shown in the machine image 134. The colors may include, for example, different hues and/or shades of red ("BAD"), green ("GOOD"), and yellow ("WARNING"). Other colors are contemplated. In some examples, providing the color-coded depiction in the machine image 134 may render it relatively easier for an engineer to evaluate and/or analyze quality related to the engineering-related data associated with the machine design (e.g., the machine chassis 502).

Figure 6:
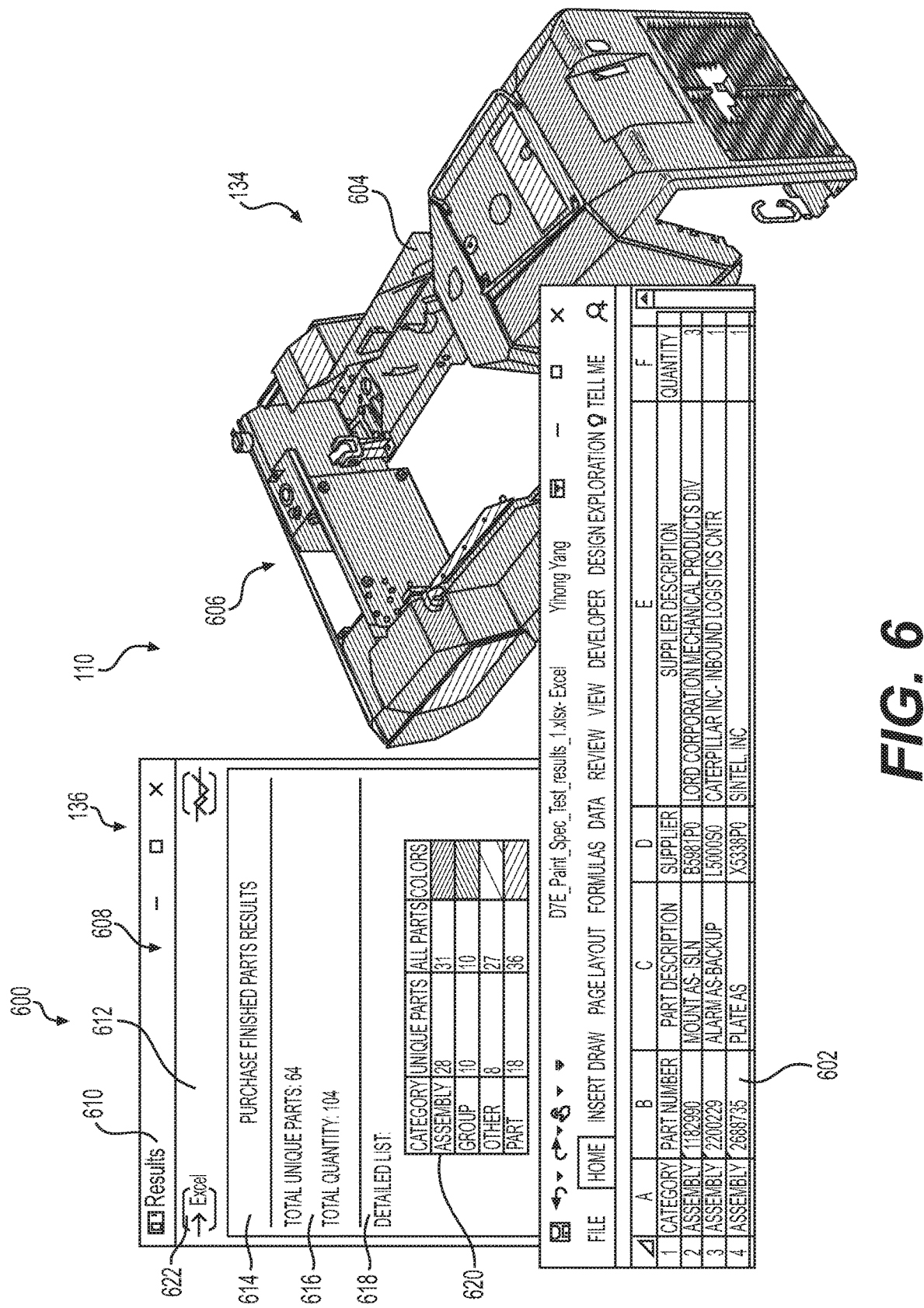
FIG. 6 is another example user interface including an example representation of a portion of an example machine design and example textual representations of supplier-related data related to the example machine design, including an example integrated spreadsheet.

FIG. 6 is another example user interface 600 including an example representation of a portion of an example machine design and example textual representations of supplier-related data related to the example machine design, including an example integrated spreadsheet 602. For example, as shown in FIG. 6, the example user interface 600 includes images 110 based on image data 132 generated by the one or more processors 112 (e.g., the quality module 114) in response to a query 106 received from the user input device 102. For example, the user 104 may submit a query 106 via the user input device 102 requesting supplier-related data associated with a machine chassis 604 shown in the example images 110 of the example user interface 600. For example, an engineer wishing to evaluate information associated with supplier-related data associated with the machine chassis 604 may submit a corresponding query 106 via a user interface (not shown in FIG. 6), and the one or more processors 112 may access a database and/or process data representative of the machine design 118, for example, as described herein. The one or more processors 112 may generate image data 132 representative of characteristics related to quality associated with the machine design, and the image data 132 may be communicated to the display device 108 to display the one or more images 110 representative of characteristics related to quality associated with the machine design. In the example shown in FIG. 6, the one or more images 110 may include a machine image 134 including a color-coded representation 606 of at least a portion of the machine associated with the machine design, and, in some examples, a textual image 136 including textual representations 608 of information related to the machine design. As described herein, the color-coded representation 606 may facilitate analysis of the one or more characteristics related to quality, for example, supplier-related data associated with the machine design, such as, for example, whether the part are available in-house or from a supplier, the name of the supplier, and whether the parts are available as individual parts, a group of unassembled parts, and/or as an assembly.

As shown in FIG. 6, in the example machine image 134, different parts of the machine chassis 604 are shown in different colors based on the supplier-related data associated with different parts of the machine chassis 604 (e.g., shown in FIG. 6 using different shading and cross-hatching techniques). In some examples, the user interface 600 may facilitate reorientation of the machine image 134, for example, as explained herein with respect to FIG. 4.

In the example shown in FIG. 6, the textual image 136 of the user interface 600 displays textual representations 608 of information related to the machine chassis 604 shown in the machine image 134. For example, the textual image 136 includes a results banner 610 ("RESULTS") indicating the textual image 136 shows results related to the query 106. The example textual image 136 also includes a selection bar 612 facilitating generation of additional information by selecting an icon associated with, for example, a spreadsheet (e.g., "EXCEL®"), for example, the spreadsheet 602 shown, and/or other functions (e.g., adding mark-ups to the machine image 134). The example user interface 600 also includes a query title field 614 identifying a title related to the query 106 (e.g., "PURCHASE FINISHED PARTS RESULTS"). The example user interface 600 also includes a parts-count field 616 showing the number of parts included in the query results (e.g., the number of parts shown in the corresponding machine image 134), which, in some examples, may be separated into different categories (e.g., total unique parts vs. all parts), for example, as shown in FIG. 6.

The example user interface 600 shown in FIG. 6 also includes a details field 618 providing a details table 620 of details related to the query 106. For example, the details table 620 shown in FIG. 6 provides a list of part categories corresponding to different supplier-related data (e.g., the number of unique parts and total number of parts of the machine chassis 604 available as an assembly ("ASSEMBLY"), parts available as a group of unassembled parts ("GROUP"), parts available as neither an assembly nor part of a group of parts ("OTHER"), and/or individual parts ("PART")). The example user interface 600 may also include color-code legend showing the color corresponding to the "ASSEMBLY" "GROUP," "OTHER," and/or "PART" characteristics shown in the machine image 134. The colors may include, for example, different hues and/or shades of red, orange, yellow, green, and/or blue. Other colors are contemplated. In some examples, providing the color-coded depiction in the machine image 134 may render it relatively easier for an engineer to evaluate and/or analyze quality related to the supplier-related data associated with the machine design (e.g., with the machine chassis 604).

As shown in FIG. 6, if the selector 622 corresponding to provision of a spreadsheet is selected in the selection bar 612, the system 100 may generate the example spreadsheet 602, which may provide additional information about the supplier-related data related to quality. For example, the spreadsheet 602 may provide one or more of a part category (e.g., assembly, group, other, or part), a part number, a part description, a supplier code, a supplier description, and/or the quantity of the part(s) required. Other supplier-related characteristics are contemplated.

Figure 7:
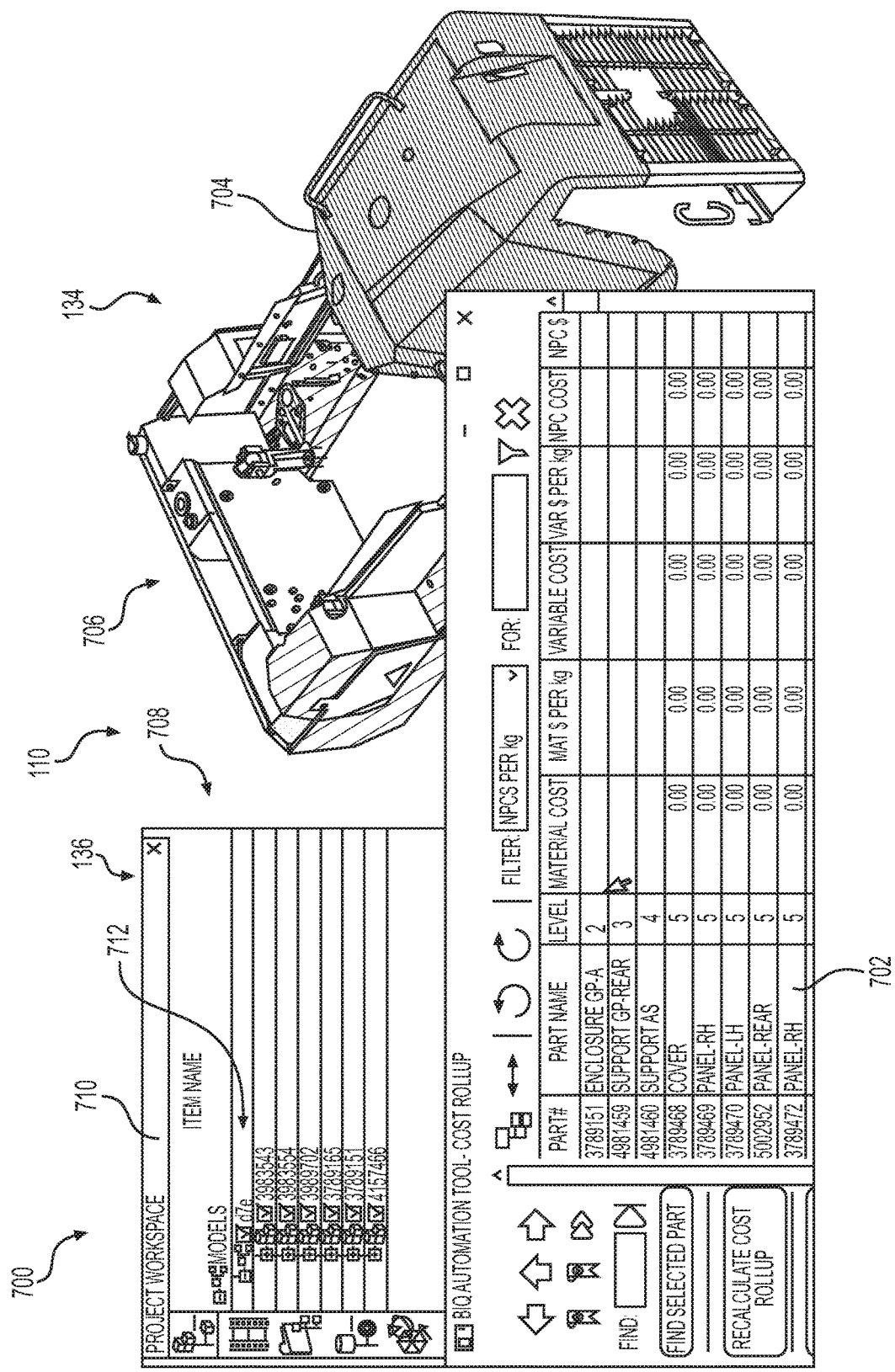
FIG. 7 is another example user interface including an example representation of a portion of an example machine design and example textual representations of cost-related data related to the example machine design, including an example integrated spreadsheet.

FIG. 7 is another example user interface 700 including an example representation of a portion of an example machine design and example textual representations of cost-related data related to the example machine design, including an example integrated spreadsheet 702. For example, as shown in FIG. 7, the example user interface 700 includes images 110 based on image data 132 generated by the one or more processors 112 (e.g., the quality module 114) in response to a query 106 received from the user input device 102. For example, the user 104 may submit a query 106 via the user input device 102 requesting cost-related data associated with a machine chassis 704 shown in the example images 110 of the example user interface 700. For example, an engineer wishing to evaluate information associated with cost-related data associated with the machine chassis 704 may submit a corresponding query 106 via a user interface (not shown in FIG. 7), and the one or more processors 112 may access a database and/or process data representative of the machine design 118, for example, as described herein. The one or more processors 112 may generate image data 132 representative of characteristics related to quality associated with the machine design, and the image data 132 may be communicated to the display device 108 to display the one or more images 110 representative of characteristics related to quality associated with the machine design. In the example shown in FIG. 7, the one or more images 110 may include a machine image 134 including a color-coded representation 706 of at least a portion of the machine associated with the machine design, and, in some examples, a textual image 136 including textual representations 708 of information related to the machine design. As described herein, the color-coded representation 706 may facilitate analysis of the one or more characteristics related to quality, for example, cost-related data associated with the machine design, such as, for example, material cost associated with the part, material cost per unit weight of the part, variable cost associated with the part, variable cost per unit weight of the part, NPC cost, etc.

As shown in FIG. 7, in the example machine image 134, different parts of the machine chassis 704 are shown in different colors based on the cost-related data associated with different parts of the machine chassis 704 (e.g., shown in FIG. 7 using different shading and cross-hatching techniques). In some examples, the user interface 700 may facilitate reorientation of the machine image 134, for example, as explained herein with respect to FIG. 4.

In the example shown in FIG. 7, the textual image 136 of the user interface 700 displays textual representations 708 of information related to the machine chassis 704 shown in the machine image 134. For example, the textual image 136 includes a results banner 710 ("PROJECT WORKSPACE") indicating the textual image 136 shows results related to the query 106. The example textual image 136 also includes a list of models 712 identifying the design models associated with the cost-related query 106. As shown, the example spreadsheet 702 provides a list of parts associated with the cost-related query 106 (e.g., parts included in the selected models), which may include the part number, part name, level of part, material cost associated with the part, material cost per unit weight of the part, variable cost associated with the part, variable cost per unit weight of the part, NPC cost, etc.

The example user interface 700 shown in FIG. 7 may also be color-coded to depict different cost levels associated with the different parts of the machine chassis 704. The colors may include, for example, different hues and/or shades of red, orange, yellow, green, and/or blue. Other colors are contemplated. In some examples, providing the color-coded depiction in the machine image 134 may render it relatively easier for an engineer to evaluate and/or analyze quality related to the cost-related data associated with the machine design (e.g., with the machine chassis 704).

Figure 8:
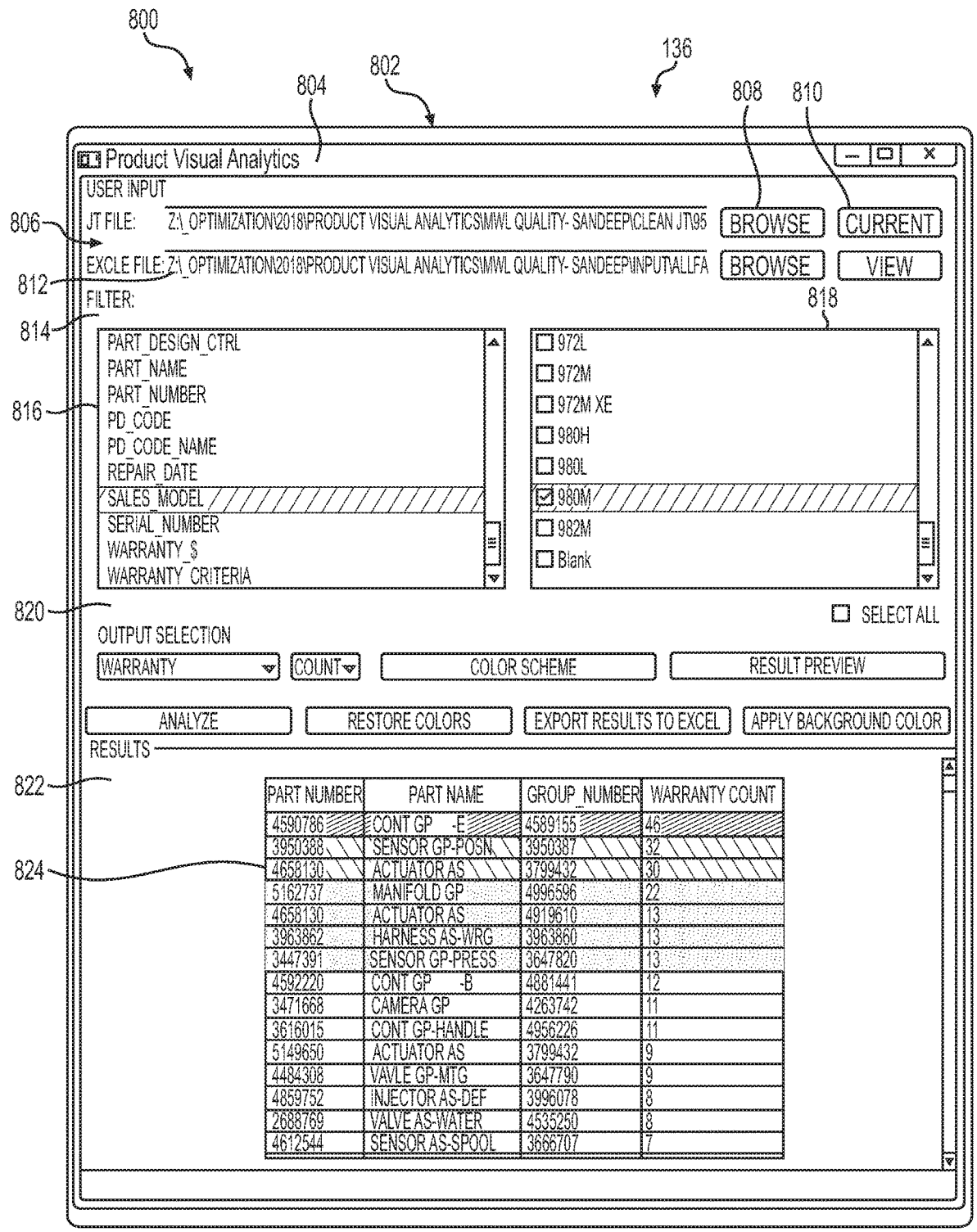
FIG. 8 is another example user interface including example textual representations of quality-related data related to an example machine design, including an example heat map related to part defects.
Figure 9:
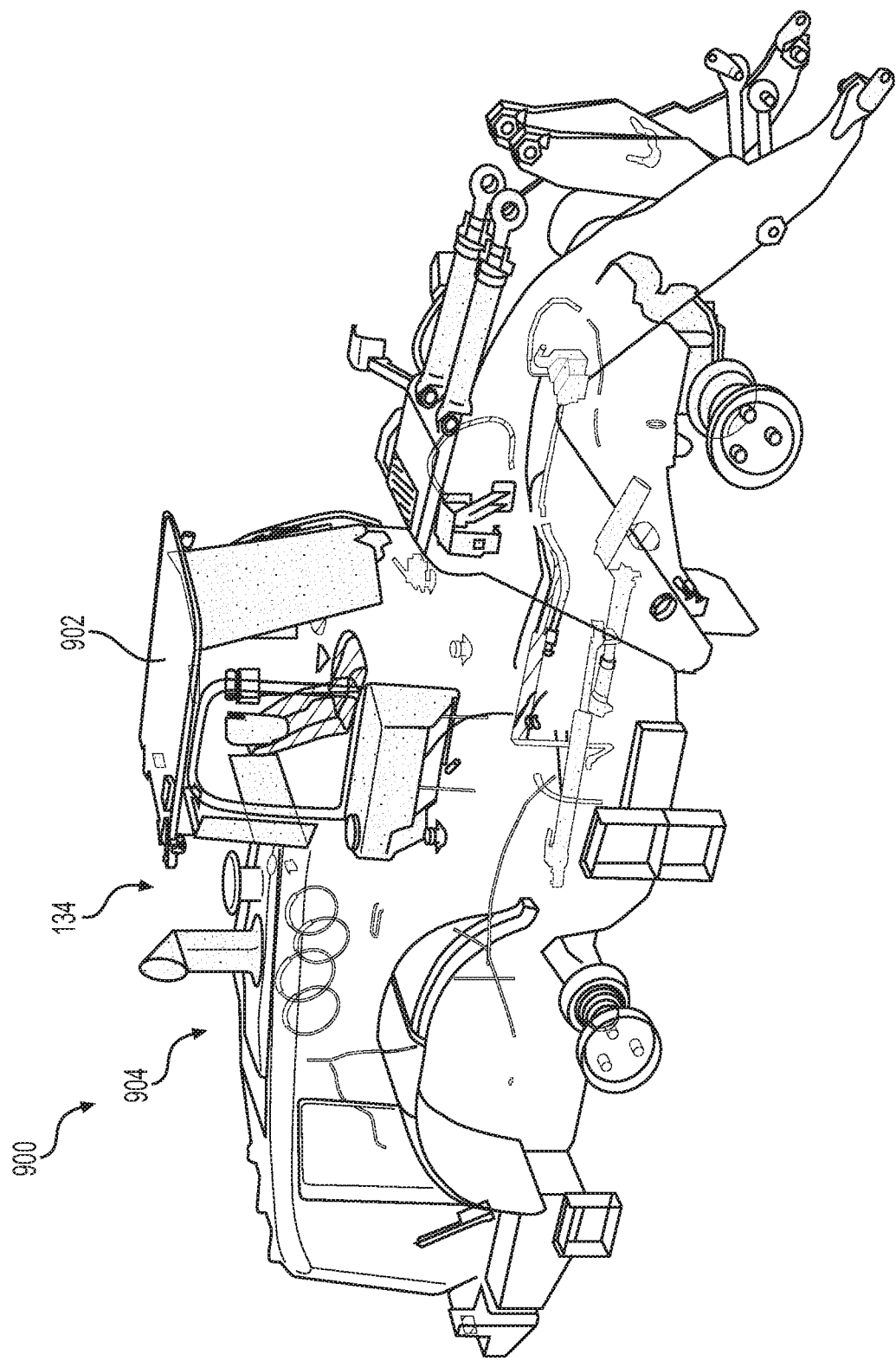
FIG. 9 is another example user interface including an example representation of a portion of an example machine design corresponding to the example textual data shown FIG. 8.

FIG. 8 is another example user interface 800 including example textual representations of quality-related data related to an example machine design, including an example heat map related to part defects, and FIG. 9 is another example user interface 900 related to the user interface 800 and including an example representation of a portion of an example machine design corresponding to the example textual data shown FIG. 8. In some examples, the user interface 800 and the user interface 900 may be shown simultaneously next to one another. As shown in FIG. 8, the example user interface 800 includes images 110 based on image data 132 generated by the one or more processors 112 (e.g., the quality module 114) in response to a query 106 received from the user input device 102. In some examples, the user interface 800 (and/or other user interfaces described herein) may include a selectable option to access data representative of a machine design. For example, the user 104 may submit a query 106 via the user input device 102 requesting warrantee-related data associated with a machine 902 shown in the example machine images 134 of the example user interface 900. For example, an engineer wishing to evaluate information associated with warrantee-related data associated with the machine 902 may submit a corresponding query 106 via a user interface 800, and the one or more processors 112 may access a database and/or process data representative of the machine design 118, for example, as described herein. In some examples, the user interface 800 (and/or other user interfaces described herein) may include a selectable option to display via a display device, based at least in part on data representative of the machine design 118, one or more images 110 representative of characteristics related to quality associated with the machine design. The one or more processors 112 may generate image data 132 representative of characteristics related to quality associated with the machine design, and the image data 132 may be communicated to the display device 108 to display the one or more images 110 representative of characteristics related to quality associated with the machine design. In the example shown in FIGS. 8 and 9, the one or more images 110 may include a machine image 134 (FIG. 9) including a color-coded representation 904 of at least a portion of the machine associated with the machine design, and, in some examples, a textual image 136 (FIG. 8) including textual representations 802 of information related to the machine design. As described herein, the color-coded representation 904 may facilitate analysis of the one or more characteristics related to quality, for example, warrantee-related data associated with the machine design, such as, for example, the number of warrantee-related incidents associated with a part or group of parts of the machine.

As shown in FIG. 9, in the example machine image 134, different parts of the machine 902 are shown in different colors based on the engineering-related data associated with different parts of the machine 902 (e.g., shown in FIG. 9 using different shading and cross-hatching techniques). In some examples, the user interface 900 may facilitate reorientation of the machine image 134, for example, as explained herein with respect to FIG. 4.

In the example shown in FIG. 8, the textual image 136 of the user interface 800 displays textual representations 802 of information related to the machine 902 shown in the machine image 134 (FIG. 9). For example, the textual image 136 includes a function banner 804 ("Product Visual Analytics") indicating the textual image 136 that the user interface 800 facilitates selection of various characteristics associated with display of the images 110 that result from the query 106. In some examples, the user interface 800 (and/or other user interfaces described herein) includes a data type selector for selecting for display at least one of images representative of the know-how-related data, images representative of the cost-related data, images representative of the reliability-related data, images representative of the warrantee-related data, images representative of the supplier-related data, or images representative of the logistics-related data. For example, the example textual image 136 shown in FIG. 8 includes two user input fields 806 for identifying a machine-related design file for which to display warrantee-related data. For example, a first user input field may facilitate selection of a particular machine design file (e.g., a JT file) of interest from a database of machine design files associated with different machine designs. For example, the user input fields 806 of the example shown in FIG. 8 include a browse button 808 for locating a desired machine design file and a current button 810 for selecting the machine design file currently (or already selected) for analysis. The example user input fields 806 also include a second file selection field 812 for selecting a second file, which may include, for example, additional information related to the warrantee-related analysis of the selected machine design.

The example user interface 800 shown in FIG. 8 also includes a filter field 814 including a filter selector field 816 facilitating selection of a filter for limiting results of the analysis to a particular first characteristic, such as, for example, sales model. Other filter characteristics are contemplated. As shown in FIG. 8, some filter fields 814 may include a second level filter selector field 818 facilitating selection of a second characteristic within the first characteristic (e.g., model number). Other second level filter characteristics are contemplated.

In some examples, the user interface 800 (and/or other user interfaces described herein) includes a quality characteristic selector for selecting for display, for example, at least one of images representative of the material-related quality, images representative of the dimension-related quality, images representative of the finish-related quality, images representative of the part compatibility-related quality, images representative of the supplier-related quality, or images representative of the shipping-related quality. For example, the user interface 800 shown in FIG. 8 includes an output selector field 820 for facilitating selection of various characteristics related to the image 110 displayed in the textual image 136 and/or the machine image 134 (FIG. 9). For example, the output selector field 820 may facilitate selection of characteristics, such as, for example, warranty-type ("WARRANTY"), number of parts ("COUNT"), a color scheme associated with the display ("COLOR SCHEME"), a result preview ("RESULT PREVIEW"), an analyze tab ("ANALYZE"), restore default colors ("RESTORE COLORS"), creation of a spreadsheet ("EXPORT TO EXCEL"), and addition of a background color ("APPLY BACKGROUND COLOR"). Other characteristics are contemplated.

In the example shown in FIG. 8, the user interface 800 also includes a results field 822. The example results field 822 includes a results table 824, including textual and color-coded information related to the warrantee-related analysis based on the user selections made via the user interface 800. For example, the results field 822 shown in FIG. 8 includes a part number list, a part name list corresponding to the part number list, a group number list identifying group numbers associated with the listed parts, and a warranty count list providing a number of warrantee-related incidents associated with each of the parts identified in the part number list. In some examples, for example, as shown, the order of the results in the results table 824 may be changed. As shown, the table lists the parts in order from the highest number of warrantee-related incidents to the lowest number of incidents. In some examples, the results table may be color-coded based on, for example, the number of warrantee-related incidents, for example, with the highest number of incidents ranging from red to orange, the middle level number of incidents ranging from light orange to light yellow-green, and the lowest number of incidents ranging from light green to green. Other color-coding schemes are contemplated. In some examples, the color-coding in the results table 624 may be carried over to the user interface 900, so that an engineer may quickly identify parts in the machine image 134 that have a relatively high number of warrantee-related incidents (and/or a relatively low number of warrantee-related incidents). In some examples, providing the color-coded depiction in the machine image 134 may render it relatively easier for an engineer to evaluate and/or analyze quality related to the warrantee-related data associated with the machine design (e.g., the machine 902).

Figure 10:
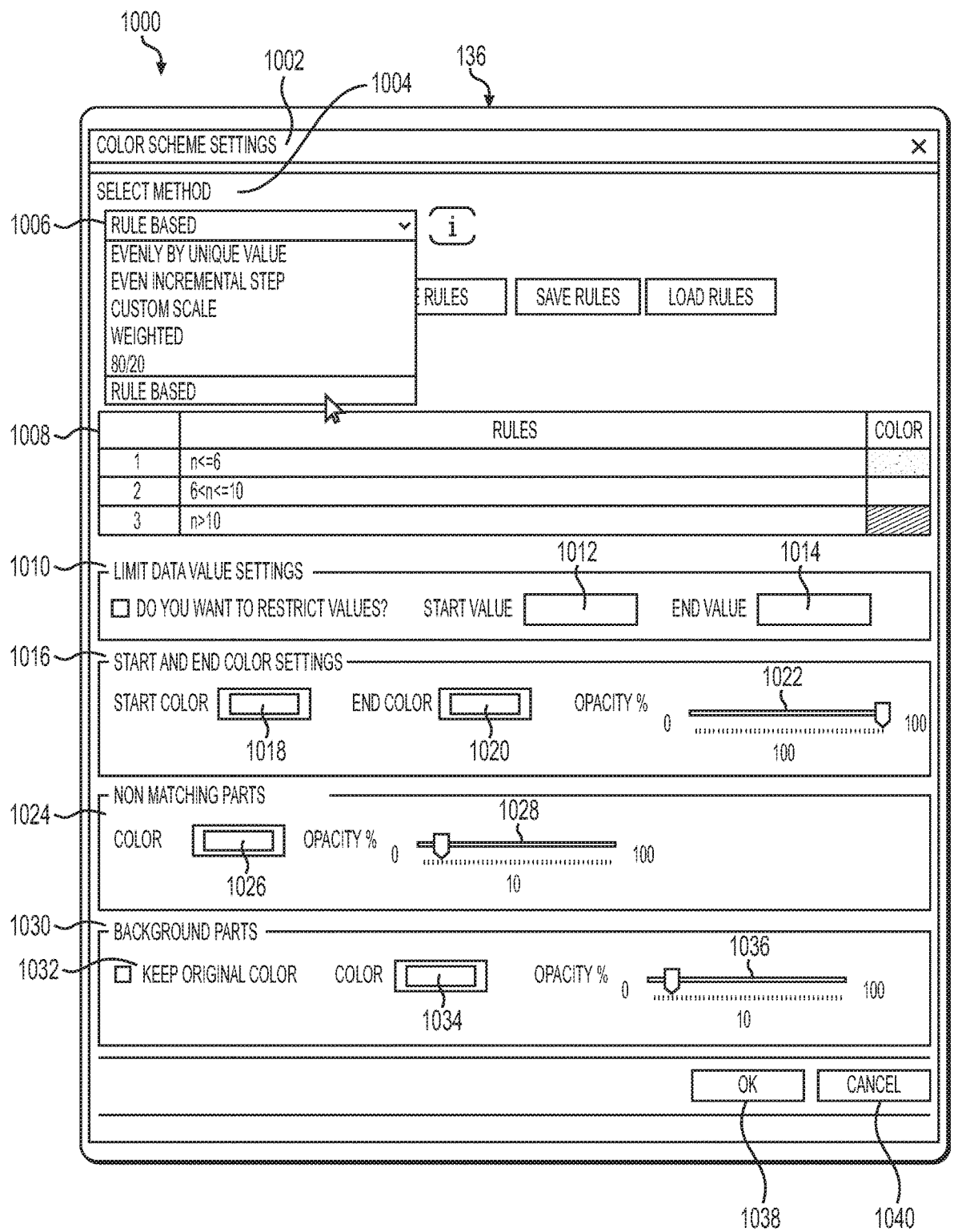
FIG. 10 is another example user interface providing example selectors for selecting a combination of colors for highlighting characteristics related to quality of a machine design.

FIG. 10 is another example user interface 1000 providing example selectors for selecting a combination of colors for highlighting characteristics related to quality of a machine design. For example, the user interface 1000 shown in FIG. 10 includes a title banner 1002 indicating the user interface 1000 is for facilitating color scheme settings of the images 110 displayed ("COLOR SCHEME SETTINGS"). In some examples of the user interface 1000 (and/or other user interfaces described herein) the user interface 1000 may include a color combination selector for selecting one combination of colors from among a plurality of combinations of colors for highlighting the characteristics related to quality. In the example shown, the user interface 1000 includes a method selection field 1004 facilitating selection by the user 104 of a color scheme method from among a drop-down menu 1006 providing a plurality of choices of color scheme methods. The example shown includes six methods, including a "RULE BASED" method, "EVENLY BY UNIQUE VALUE," "EVEN INCREMENTAL STEP," "CUSTOM SCALE," "WEIGHTED," and "80/20." Other color scheme methods are contemplated. In addition, some examples, such as shown, include a method subfield 1008 facilitating selection or definition of additional color scheme-related characteristics by the user 104. For example, if the user 104 selects the rule-based color scheme, the method subfield may facilitate definition of rules for implementing the rule-based color scheme. For example, as shown, a user has selected the rule-based method, and in the method subfield 1008 established criteria for showing information related to quality in different colors based on the value of the query results for different parts. Definition of other criteria in the method subfield 1008 is contemplated, for example, depending on the method selected by the user 104 using the drop-down menu 1006.

The example user interface 1000 shown in FIG. 10 also includes a data range selector 1010 for facilitating limiting the query results displayed to a range of data values. For example, the example data range selector 1010 provides a first range end field 1012 ("START VALUE") and a second range end field 1014 ("END VALUE") for setting the end points of the data range. This may permit the user 104 to limit the display of query results to a range of values of interest.

The example user interface 1000 shown in FIG. 10 also includes a color settings field 1016 for facilitating selection of a range of display colors, for example, from red, to orange, to yellow, to green, to blue, to indigo, and to violet. In some examples, different hues and/or shades of colors may be specified. In the example shown, the color setting field 1016 includes a starting color field 1018 ("START COLOR") and an ending color field 1020 ("END COLOR") for facilitating selection of the starting and ending colors of the range of colors for displaying the images 110. In some examples, such as shown, the color setting field may also include an opacity slider 1022 ("OPACITY") for selecting the opacity of the displayed colors (from "0%" to "100%").

The example user interface 1000 also includes an alert color setting field 1024 facilitating selection by the user 104 of a color for highlighting parts for which it might be advisable to identify, such as, for example, non-matching parts. In some examples, the alert color setting field 1024 may include a color setting field 1026 ("COLOR") for selecting a display color and an opacity slider 1028 ("OPACITY") for selecting the opacity of the displayed color (from "0%" to "100%").

The example user interface 1000 also includes a background part color setting field 1030 for facilitating selection by the user 104 of a display color for background parts (e.g., parts not relevant to the query 106). Some examples of the background part color setting field 1030 may include an original color selection block 1032 ("KEEP ORIGINAL COLOR") for not changing the background parts color for parts not relevant to the query 106, a color setting field 1034 ("COLOR") for selecting a display color for the background parts, and an opacity slider 1036 ("OPACITY") for selecting the opacity of the displayed background part color (from "0%" to "100%").

In addition, the example user interface 1000 shown in FIG. 10 also includes an acceptance button 1038 ("OKAY") for confirming and executing the user selections made via the user interface 1000 and a denial button 1040 ("CANCEL") for canceling the user selections made via the user interface 1000.

Figure 11:
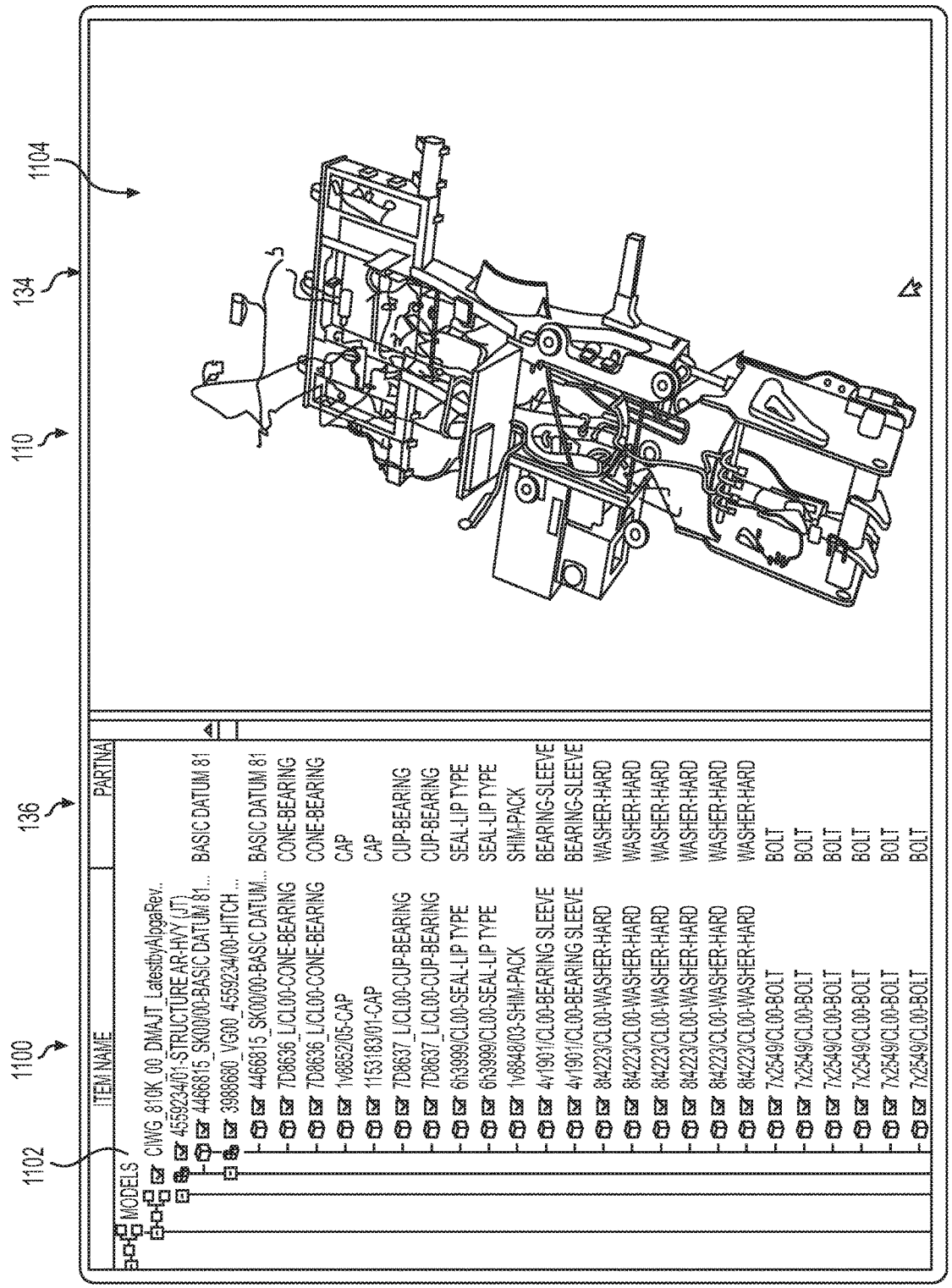
FIG. 11 schematically depicts an example data list associated with an example three-dimensional data format representative of an example machine design, and an example representation of a portion of an example machine design corresponding to the example data list.

FIG. 11 schematically depicts an example user interface 1100 including an example data list 1102 associated with an example three-dimensional data format representative of an example machine design, and an example representation 1104 of a portion of an example machine design corresponding to the example data list. For example, the user interface 1100 displays a machine image 134 corresponding to the example representation 1104 and a textual image 136 corresponding to the example data list 1102. The example data list 1102 shown in FIG. 11 includes a JT file corresponding to the machine design and includes a three-dimensional data format of parts included in the machine. In the example shown, the textual image 136 displays a list of the models involved in the quality-related analysis including models of the various parts involved in the quality-related analysis. As explained herein, in some examples of the system 100, the one or more processors 112 may be configured to process portions the data list 1102 at least partially concurrently rather than sequentially (e.g., from one end of the data list 1102 to the other end of the data list 1102). In some examples, this may result in reducing the time for processing that data list 1102 to about one-tenth, one-eighth, one-sixth, one-fifth, one-fourth, one-third, a or one-half relative to the time required to sequentially process the data list 1102.

Figure 12:
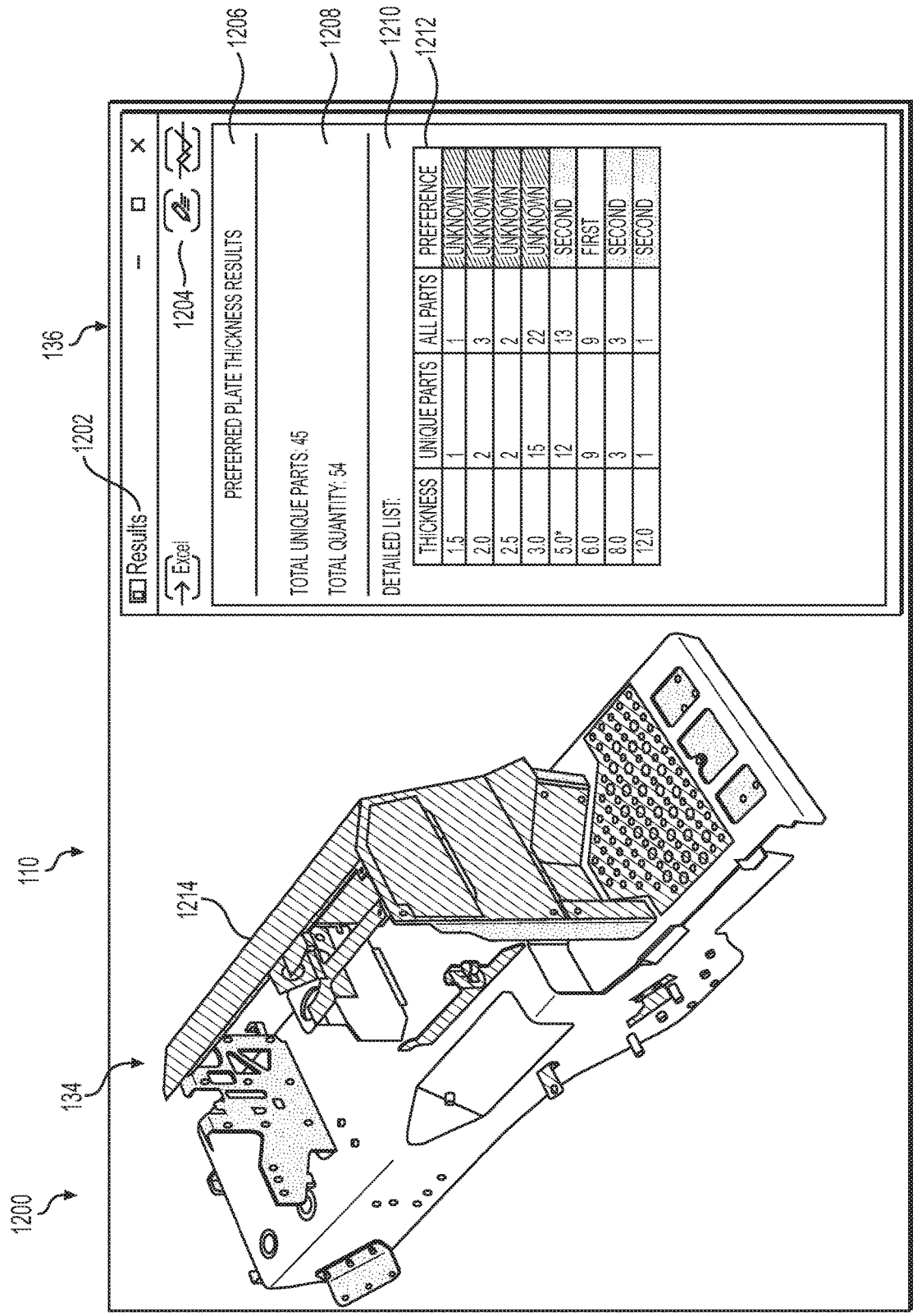
FIG. 12 is another example user interface including an example representation of a portion of an example machine design and example textual representations of know-how-related data related to the example machine design.

FIG. 12 is another example user interface 1200 including an example representation of a portion of an example machine design (e.g., a machine image 134) and example textual representations (e.g., a textual image 136) of know-how-related data related to the example machine design. In some examples, the know-how-related data may be representative of one or more of preferred design characteristics, hardware verification, a thickness analysis, sub-standard part identification, a hose-material and hose-size verification, preferred materials, preferred sizes, or design verification. Other know-how-related data is contemplated. Know-how-related data may be data related to preferred practices of an enterprise and may be based on, for example, engineering know-how, empirically-derived data, prototype testing, simulation testing, and/or experience.

In the example shown in FIG. 12, the textual image 136 may include a results banner 1202 ("RESULTS") indicating the textual image 136 shows results related to the query 106. The example textual image 136 also includes a selection bar 1204 facilitating generation of additional information by selecting an icon associated with, for example, a spreadsheet (e.g., "EXCEL®") and/or other functions (e.g., creating a text box and/or adding mark-ups to the machine image 134). The example user interface 1200 also includes a query title field 1206 identifying a title related to the query 106 (e.g., "PREFERRED PLATE THICKNESS RESULTS"). The example user interface 1200 also includes a parts-count field 1208 showing the number of parts included in the query results (e.g., the number of parts shown in the corresponding machine image 134), which in some examples, may be separated into different categories (e.g., total unique parts vs. total parts), for example, as shown in FIG. 12.

The example user interface 1200 shown in FIG. 12 also includes a details field 1210 providing a details table 1212 of details related to the query 106. For example, the details table 1212 shown in FIG. 12 provides a list of the different part thicknesses and corresponding data related to the different thicknesses (e.g., the number of unique parts of the machine chassis 1214 having the listed thickness, the total number of parts having the listed thickness, and a color-code legend showing the color corresponding to the listed thickness and the corresponding part(s) shown in the machine image 134 having the listed thickness). The colors may include, for example, different hues and/or shades of red orange, yellow, green, blue, indigo, and violet. In some examples, providing the color-coded depiction in the machine image 134 may render it relatively easier for an engineer to evaluate and/or analyze quality related to the plate thicknesses (or other characteristics) associated with the machine design. The example details table 1212 shown in FIG. 12 also includes a preference list showing preferences (including "unknown") for each of the part thicknesses in the details table 1212. In some examples, one or more of the preferences may be based on know-how. In some examples, the preferences may be color-coded (e.g., red for "unknown," yellow for "second," and green for "first").

Figure 13:
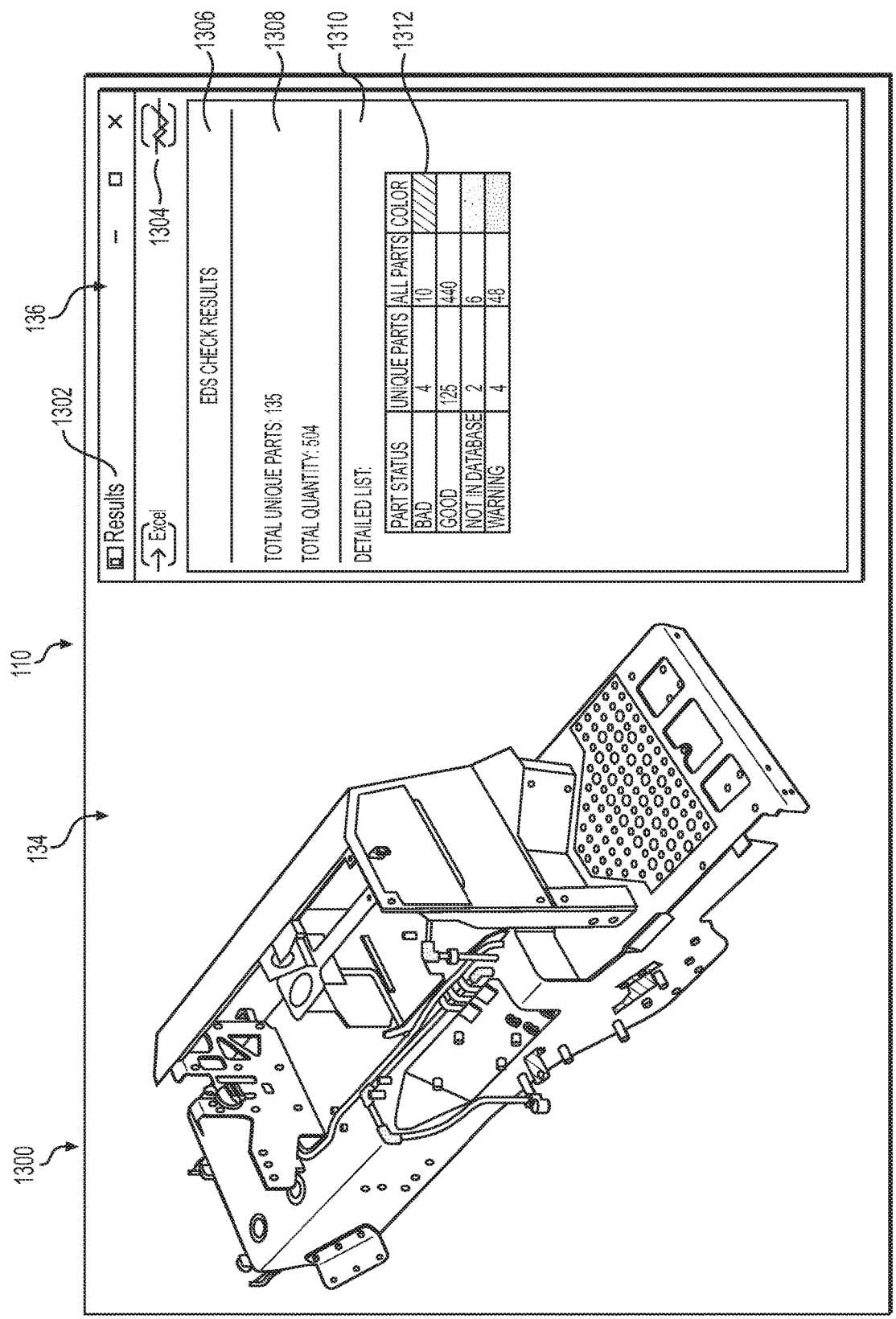
FIG. 13 is another example user interface including an example representation of a portion of an example machine design and example textual representations of know-how-related data related to the example machine design.

FIG. 13 is another example user interface 1300 including an example representation of a portion of an example machine design (e.g., a machine image 134) and example textual representations (e.g., a textual image 136) of know-how-related data related to the example machine design. In some examples, the know-how-related data may be representative of one or more of preferred design characteristics, hardware verification, a thickness analysis, sub-standard part identification ("EDS CHECK REULTS"), a hose-material and hose-size verification, preferred materials, preferred sizes, or design verification. Other know-how-related data is contemplated.

In the example shown in FIG. 13, the textual image 136 may include a results banner 1302 ("RESULTS") indicating the textual image 136 shows results related to the query 106. The example textual image 136 also includes a selection bar 1304 facilitating generation of additional information by selecting an icon associated with, for example, a spreadsheet (e.g., "EXCEL®") and/or other functions (e.g., creating a text box and/or adding mark-ups to the machine image 134). The example user interface 1300 also includes a query title field 1306 identifying a title related to the query 106 (e.g., "EDS CHECK RESULTS"). The example user interface 1300 also includes a parts-count field 1308 showing the number of parts included in the query results (e.g., the number of parts shown in the corresponding machine image 134), which in some examples, may be separated into different categories (e.g., total unique parts vs. total parts), for example, as shown in FIG. 13.

The example user interface 1300 shown in FIG. 13 also includes a details field 1310 providing a details table 1312 of details related to the query 106. For example, the details table 1312 shown in FIG. 13 provides a list of the status of different parts providing a parts count for each of "BAD" parts, "GOOD" parts, parts "NOT IN DATABASE," and "WARNING" parts. In the example shown, the details table 1312 also includes a color-code legend showing the color corresponding to the listed part status (e.g., red for "BAD" parts, green for "GOOD" parts, blue for parts "NOT IN DATABASE," and yellow for "WARNING" parts) and used in the machine image 134. Other colors are contemplated. For example, the colors may include, for example, different hues and/or shades of red orange, yellow, green, blue, indigo, and violet. In some examples, providing the color-coded depiction in the machine image 134 may render it relatively easier for an engineer to evaluate and/or analyze quality related to the acceptable parts (or other characteristics) associated with the machine design.

FIG. 14 illustrates an example process for evaluating characteristics related to quality associated with a machine design. This process is illustrated as a logical flow graph, operation of which represents a sequence of operations, at least some of which may be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the process.

FIG. 14 illustrates a flow diagram of an example process 1400 for evaluating characteristics related to quality associated with a machine design, for example, as described herein. The following actions described with respect to FIG. 14 may be performed, for example, as illustrated with respect to FIGS. 1-13.

The example process 1400, at 1402, may include receiving a query from a user input device, the query related to one or more characteristics related to quality associated with the machine design. For example, a user may use a user input device to communicate via one or more networks a query to one or more processors requesting one or more characteristics related to quality associated with the machine design.

At 1404, the process 1400, in some examples, may include accessing, based at least in part on the query, data representative of the machine design. For example, the one or more processors may access a database including data representative of a machine design, for example, as described herein. For example, accessing data representative of the machine design may include accessing a three-dimensional data format representative of the machine design. In some examples of the process 1400, accessing data representative of the machine design may include accessing at least one of know-how-related data, cost-related data, reliability-related data, warrantee-related data, supplier-related data, or logistics-related data. For example, the know-how-related data may be representative of at least one of preferred design characteristics, hardware verification, a thickness analysis, sub-standard part identification, a hose-material and hose-size verification, preferred materials, preferred sizes, or design verification.

At 1406, the example process 1400 may include generating image data representative of characteristics related to quality associated with the machine design. For example, the characteristics related to quality include at least one of material-related quality, dimension-related quality, finish-related quality, part compatibility-related quality, supplier-related quality, or shipping-related quality.

The example process 1400 may also include, at 1408, displaying via a display device, based at least in part on the image data, one or more images representative of characteristics related to quality associated with the machine design. In some examples, the one or more images representative of characteristics related to quality associated with the machine design may include a color-coded representation of at least a portion of a machine associated with the machine design, and textual representations of information related to the machine design. In some examples, the color-coded representation may facilitate analysis of the one or more characteristics related to quality, for example, as described herein. In some examples, the color-coded representation may include a combination of colors for highlighting the characteristics related to quality, and the method may also include facilitating selection of one combination of colors from among a plurality of combinations of colors for highlighting the characteristics related to quality, wherein each of the combinations of colors differs from one another. In some examples, the textual representations of information related to the machine design may include one or more tables supplementing the color-coded representations, and wherein the textual representations are color-coded.

In some examples of the process 1400, the data representative of machine design may include a three-dimensional data format representative of the machine design, and the three-dimensional data format may include a plurality of nodes. In some such examples, the process 1400 may include arranging, based at least in part on the query related to one or more characteristics related to quality associated with the machine design, the plurality of nodes into a node tree structure including a plurality of node branches. In some such examples, the process 1400 may further include generating the image data representative of characteristics related to quality associated with the machine design by processing two or more of the node branches substantially concurrently.

INDUSTRIAL APPLICABILITY

The example systems and methods of the present disclosure may be applicable to efficiently evaluating characteristics related to quality associated with a machine design or process. For example, as a product or process proceeds from concept, to design, development, manufacturing, and shipment, it may be subjected to multiple internal reviews of the level of quality of the product or process. As a product or process becomes more complex, multiple organizational groups may be involved with such reviews. For example, a complex machine may include tens or even hundreds of parts that may be designed, developed, and/or obtained from different entities, including, for example, both in-house manufacturing groups and outside suppliers. At least some systems and methods described herein may facilitate reviews of the level of quality of a product or process that are performed in a consistent and/or satisfactory manner by one or more of the entities. In addition, for products or processes that are particularly complex, at least some of the systems and methods described herein may facilitate processing large amounts of data associated with the products or processes to create user interfaces that result in efficient analysis of the one or more characteristics related to quality associated with the product or process. For example, the systems and methods may process machine design models and associated data in a manner that results in more efficient use of computing resources, for example, by processing data associated with the machine design models and associated data in a substantially concurrent manner rather than in a sequential manner. As a result, the processing may be completed in substantially less time, for example, as compared to a sequential processing method, as explained herein.

Some systems and methods for facilitating evaluation of characteristics related to quality associated with a machine design may include a user input device configured to generate a query related to one or more characteristics related to quality associated with the machine design. The system may also include a display device configured to display images representative of characteristics related to quality associated with the machine design, and a processor in communication with the user input device and the display device. The processor may be configured to receive the query from the user input device. The query may be related to one or more characteristics related to quality associated with the machine design. The processor may also be configured to access, based at least in part on the query, data representative of the machine design, and generate image data representative of characteristics related to quality associated with the machine design. The image data may be communicated to the display device to display one or more images representative of characteristics related to quality associated with the machine design. The one or more images representative of characteristics related to quality associated with the machine design may include a machine image including a color-coded representation of at least a portion of a machine associated with the machine design, and a textual image including textual representations of information related to the machine design. The color-coded representation may facilitate analysis by one or more engineers of the one or more characteristics related to quality.

In some examples, the systems and methods may be capable of accessing numerous databases and providing images facilitating review of quality-related characteristics associated with a machine or process. In some examples, the systems and methods may be used by numerous entities, either in-house or outside venders, to review quality-related characteristics, thereby providing a consistent manner of review by the numerous entities. Some examples of the systems and methods may be configured to access data related to one or more of engineering-related data, know-how-related data, cost-related data, reliability-related data, warrantee-related data, supplier-related data, or logistics-related data, and provide textual images and/or machine images to facilitate review of characteristics related to quality, which may include, for example, material-related quality, dimension-related quality, finish-related quality, part compatibility-related quality, supplier-related quality, and/or shipping-related quality. In addition, some examples of the systems and methods may facilitate tailoring of the images based on user preferences, for example, so that different users may more easily evaluate quality-related characteristics.

While aspects of the present disclosure have been particularly shown and described with reference to the embodiments above, it will be understood by those skilled in the art that various additional embodiments may be contemplated by the modification of the disclosed machines, systems, and methods without departing from the spirit and scope of what is disclosed. Such embodiments should be understood to fall within the scope of the present disclosure as determined based upon the claims and any equivalents thereof.

What is claimed is:

1. A system for facilitating evaluation of characteristics related to quality associated with a machine design, the system comprising:
a user input device configured to generate a query related to one or more characteristics related to quality associated with the machine design;
a display device configured to display images representative of characteristics related to quality associated with a machine design; and
a processor in communication with the user input device and the display device, the processor configured to:
receive a query from the user input device, the query related to one or more characteristics related to quality associated with the machine design;
access, based at least in part on the query, data representative of the machine design, the data including a three-dimensional data format having a plurality of nodes;
arrange, based at least in part on the query, the plurality of nodes into a node tree structure including a plurality of node branches;
generate, by processing two or more node branches of the plurality of node branches substantially concurrently, image data representative of characteristics related to quality associated with the machine design; and
display via the display device, based at least in part on the image data, one or more images representative of characteristics related to quality associated with the machine design,
wherein the one or more images representative of characteristics related to quality associated with the machine design include:
a machine image including a color-coded representation of at least a portion of a machine associated with the machine design; and
a textual image including textual representations of information related to the machine design,
wherein the color-coded representation facilitates analysis of the one or more characteristics related to quality.

2. The system of claim 1, wherein the data representative of machine design includes at least one of know-how-related data, cost-related data, reliability-related data, warrantee-related data, supplier-related data, or logistics-related data.

3. The system of claim 1, wherein the data representative of machine design includes know-how-related data, and the know-how-related data is representative of at least one of preferred design characteristics, hardware verification, a thickness analysis, sub-standard part identification, a hose-material and hose-size verification, preferred materials, preferred sizes, or design verification.

4. The system of claim 1, wherein the characteristics related to quality include at least one of material-related quality, dimension-related quality, finish-related quality, part compatibility-related quality, supplier-related quality, or shipping-related quality.

5. The system of claim 1, wherein the color-coded representation includes a combination of colors for highlighting the characteristics related to quality,
wherein the processor is configured to facilitate selection of one combination of colors from among a plurality of combinations of colors for highlighting the characteristics related to quality, and
wherein each of the combinations of colors differs from one another.

6. The system of claim 1, wherein the textual representations of information related to the machine design include one or more tables supplementing the color-coded representations, and wherein the textual representations are color-coded.

7. A computer-implemented method for evaluating characteristics related to quality associated with a machine design, the method comprising:
receiving a query from a user input device, the query related to one or more characteristics related to quality associated with the machine design;
accessing, based at least in part on the query, data representative of the machine design, the data including a three-dimensional data format having a plurality of nodes;
arranging, based at least in part on the query, the plurality of nodes into a node tree structure including a plurality of node branches;
generating, by processing two or more node branches of the plurality of node branches substantially concurrently, image data representative of characteristics related to quality associated with the machine design; and
displaying via a display device, based at least in part on the image data, one or more images representative of characteristics related to quality associated with the machine design,
wherein the one or more images representative of characteristics related to quality associated with a machine design include:
a color-coded representation of at least a portion of a machine associated with the machine design; and
textual representations of information related to the machine design,
wherein the color-coded representation facilitates analysis of the one or more characteristics related to quality.

8. The method of claim 7, wherein accessing data representative of the machine design includes accessing at least one of know-how-related data, cost-related data, reliability-related data, warrantee-related data, supplier-related data, or logistics-related data.

9. The method of claim 7, wherein accessing data representative of the machine design includes accessing know-how-related data, and the know-how-related data is representative of at least one of preferred design characteristics, hardware verification, a thickness analysis, sub-standard part identification, a hose-material and hose-size verification, preferred materials, preferred sizes, or design verification.

10. The method of claim 7, wherein the characteristics related to quality include at least one of material-related quality, dimension-related quality, finish-related quality, part compatibility-related quality, supplier-related quality, or shipping-related quality.

11. The method of claim 7, wherein the color-coded representation includes a combination of colors for highlighting the characteristics related to quality, and the method includes facilitating selection of one combination of colors from among a plurality of combinations of colors for highlighting the characteristics related to quality, wherein each of the combinations of colors differs from one another.

12. The method of claim 7, wherein the textual representations of information related to the machine design include one or more tables supplementing the color-coded representations, and wherein the textual representations are color-coded.

13. A system comprising:
one or more processors; and
memory storing computer-executable instructions that, when executed, cause the one or more processors to generate a user interface comprising:
a selectable first option to access data representative of a machine design, the data including a three-dimensional data format having a plurality of nodes, wherein based at least in part on receipt of an input indicating selection of the first option, the instructions cause the one or more processors to:
arrange the plurality of nodes into a node tree structure including a plurality of node branches, and
generate image data by processing two or more node branches of the plurality of node branches substantially concurrently; and
a selectable second option to display via a display device, based at least in part on the image data, one or more images representative of characteristics related to quality associated with the machine design;
wherein the one or more images representative of characteristics related to quality associated with a machine design include:
a color-coded representation of at least a portion of a machine associated with the machine design; and
textual representations of information related to the machine design, wherein the color-coded representation facilitates analysis of the one or more characteristics related to quality.

14. The system of claim 13, wherein the color-coded representation includes a combination of colors for highlighting the characteristics related to quality, and wherein the user interface further includes a color combination selector for selecting one combination of colors from among a plurality of combinations of colors for highlighting the characteristics related to quality, wherein each of the combinations of colors differs from one another.

15. The system of claim 13, wherein the data representative of machine design includes at least one of know-how-related data, cost-related data, reliability-related data, warrantee-related data, supplier-related data, or logistics-related data, and
wherein the user interface includes a data type selector for selecting for display at least one of images representative of the know-how-related data, images representative of the cost-related data, images representative of the reliability-related data, images representative of the warrantee-related data, images representative of the supplier-related data, or images representative of the logistics-related data.

16. The system of claim 13, wherein the characteristics related to quality include at least one of material-related quality, dimension-related quality, finish-related quality, part compatibility-related quality, supplier-related quality, or shipping-related quality, and
wherein the user interface includes a quality characteristic selector for selecting for display at least one of images representative of the material-related quality, images representative of the dimension-related quality, images representative of the finish-related quality, images representative of the part compatibility-related quality, images representative of the supplier-related quality, or images representative of the shipping-related quality.

* * * * *